(12) United States Patent
Ishida et al.

(10) Patent No.: US 10,983,179 B2
(45) Date of Patent: *Apr. 20, 2021

(54) MAGNETIC FIELD MEASURING DEVICE, MAGNETIC FIELD MEASUREMENT METHOD, AND RECORDING MEDIUM HAVING RECORDED THEREON MAGNETIC FIELD MEASUREMENT PROGRAM

(71) Applicant: Asahi Kasei Microdevices Corporation, Tokyo (JP)

(72) Inventors: Kazuhiro Ishida, Tokyo (JP); Masanori Masuda, Tokyo (JP); Takenobu Nakamura, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/458,211

(22) Filed: Jul. 1, 2019

(65) Prior Publication Data
US 2020/0003847 A1 Jan. 2, 2020

(30) Foreign Application Priority Data

Jul. 2, 2018 (JP) .............................. JP2018-126201
May 16, 2019 (JP) .............................. JP2019-093087

(51) Int. Cl.
*G01V 3/00* (2006.01)
*G01R 33/00* (2006.01)
*G01R 33/09* (2006.01)

(52) U.S. Cl.
CPC ..... *G01R 33/0041* (2013.01); *G01R 33/0029* (2013.01); *G01R 33/093* (2013.01); *G01R 33/098* (2013.01)

(58) Field of Classification Search
CPC ............ G01R 33/0017; G01R 33/0029; G01R 33/0041; G01R 33/0011; G01R 33/0092;
(Continued)

(56) References Cited

U.S. PATENT DOCUMENTS

| 4,931,727 A | 6/1990 | Yamanoue |
| 7,091,717 B2 | 8/2006 | Lee |

(Continued)

FOREIGN PATENT DOCUMENTS

| JP | 2014052262 A | 3/2014 |
| JP | 2015152378 A | 8/2015 |

(Continued)

OTHER PUBLICATIONS

Office Action issued for U.S. Appl. No. 16/458,210, issued by the U.S. Patent Trademark Office dated Jul. 28, 2020.

*Primary Examiner* — Thang X Le

(57) ABSTRACT

A magnetic field measuring device that can measure a weaker magnetic field is provided. A magnetic field measuring device is provided, the magnetic field measuring device including: a sensor unit that has at least one magnetoresistive element; a reference voltage generating unit that outputs a reference voltage; a magnetic field generating unit that generates a magnetic field to be applied to the sensor unit; a feedback current generating unit that supplies, according to a difference between an output voltage of the sensor unit and the reference voltage, the magnetic field generating unit with a feedback current that generates a feedback magnetic field to diminish an input magnetic field to the sensor unit; a magnetic field measuring unit that outputs a measurement value corresponding to the feedback current; and an adjusting unit that uses the output voltage of the sensor unit to adjust the reference voltage.

23 Claims, 23 Drawing Sheets

(58) Field of Classification Search
CPC .......... G01R 33/093; G01R 33/0094; G01R 33/098; G01R 33/07; G01R 33/09; G01R 33/0356; G01R 33/038; G01R 33/0385; G01R 15/205; G01R 15/207; G01R 31/364

See application file for complete search history.

(56) References Cited

U.S. PATENT DOCUMENTS

| | | | |
|---|---|---|---|
| 8,063,634 B2 * | 11/2011 | Sauber | B82Y 25/00 |
| | | | 324/252 |
| 9,239,365 B2 * | 1/2016 | Oikawa | G01R 33/04 |
| 9,417,293 B2 * | 8/2016 | Schaffer | G01R 33/04 |
| 2010/0026289 A1 * | 2/2010 | Taylor | G01R 15/205 |
| | | | 324/252 |
| 2011/0221433 A1 | 9/2011 | Ohta | |
| 2012/0062224 A1 * | 3/2012 | Ide | G01R 15/205 |
| | | | 324/252 |
| 2013/0033260 A1 | 2/2013 | Nomura | |
| 2013/0106412 A1 * | 5/2013 | Nomura | G01R 33/00 |
| | | | 324/252 |
| 2013/0214778 A1 | 8/2013 | Chen | |
| 2015/0077101 A1 | 3/2015 | Oikawa | |
| 2016/0313122 A1 | 10/2016 | Bhattacharyya | |

FOREIGN PATENT DOCUMENTS

| | | |
|---|---|---|
| JP | 2017083173 A | 5/2017 |
| JP | 2017096627 A | 6/2017 |
| JP | 2018112481 A | 7/2018 |
| WO | 9528693 A1 | 10/1995 |

* cited by examiner

MAGNETIC FIELD MEASURING DEVICE, MAGNETIC FIELD MEASUREMENT METHOD, AND RECORDING MEDIUM HAVING RECORDED THEREON MAGNETIC FIELD MEASUREMENT PROGRAM

The contents of the following Japanese patent application(s) are incorporated herein by reference:
2018-126201 filed in JP on Jul. 2, 2018
2019-093087 filed in JP on May 16, 2019

BACKGROUND

1. Technical Field

The present invention relates to a magnetic field measuring device, a magnetic field measurement method, and a recording medium having recorded thereon a magnetic field measurement program.

2. Related Art

There are known magnetic sensors in which one TMR element and three fixed resistors are used to form a bridge circuit, an electrical power for causing a current to flow through a magnetic field generating coil is generated based on an output voltage of the bridge circuit, and a magnetic field is applied to the TMR module by using the magnetic field generating coil (see Patent Literature 1, for example). In addition, there are known magnetic sensors in which one TMR element and three fixed resistors are used to form a bridge circuit, and a voltage to be applied to the bridge circuit is controlled based on an output voltage of the bridge circuit (see Patent Literature 2, for example).

Patent Literature 1: Japanese Patent Application Publication No. 2017-083173
Patent Literature 2: Japanese Patent Application Publication No. 2017-096627

SUMMARY

In conventional magnetic sensors, the magnetic operating point of a TMR element shifts to a magnetic saturation region where the magnetic resolution lowers depending on the balance between individual resistance values of resistors constituting a bridge circuit. However, for example in biomagnetic field measurement such as magnetocardiographic measurement, it is desired to realize a magnetic field measuring device that can measure a weaker magnetic field.

In order to overcome the drawbacks explained above, a first aspect of the present invention provides a magnetic field measuring device. The magnetic field measuring device may include a sensor unit that has at least one magnetoresistive element. The magnetic field measuring device may include a reference voltage generating unit that outputs a reference voltage. The magnetic field measuring device may include a magnetic field generating unit that generates a magnetic field to be applied to the sensor unit. The magnetic field measuring device may include a feedback current generating unit that supplies, according to a difference between an output voltage of the sensor unit and the reference voltage, the magnetic field generating unit with a feedback current that generates a feedback magnetic field to diminish an input magnetic field to the sensor unit. The magnetic field measuring device may include a magnetic field measuring unit that outputs a measurement value corresponding to the feedback current. The magnetic field measuring device may include an adjusting unit that uses the output voltage of the sensor unit to adjust the reference voltage.

In an adjustment phase, the adjusting unit may adjust the reference voltage, and in a measurement phase, the magnetic field measuring unit may output a measurement value corresponding to the feedback current generated for a measurement-target magnetic field.

The reference voltage generating unit may have at least one variable resistor, and the adjusting unit may change a resistance value of the variable resistor to adjust the reference voltage.

The adjusting unit may adjust the reference voltage based on the feedback current.

Upon the sensor unit receiving an adjustment magnetic field, the adjusting unit may adjust the reference voltage such that the measurement value falls within a predetermined range as a result of the reception of the adjustment magnetic field.

The adjusting unit may adjust the reference voltage so as to lower a variance of the feedback current.

The magnetic field measuring device may further include a switching unit that switches whether to or not to supply the feedback current to the magnetic field generating unit, the adjusting unit uses the output voltage of the sensor unit generated while the feedback current is not being supplied to the magnetic field generating unit to adjust the reference voltage.

Upon the sensor unit receiving an adjustment magnetic field while the feedback current is not being supplied to the magnetic field generating unit, the adjusting unit may adjust the reference voltage such that the difference between the output voltage of the sensor unit and the reference voltage falls within a predetermined range as a result of the reception of the adjustment magnetic field.

The magnetic field measuring device may further include an adjustment current generating unit that generates an adjustment current, wherein the switching unit supplies the adjustment current to the magnetic field generating unit if the feedback current is not supplied to the magnetic field generating unit, and the adjusting unit uses the output voltage of the sensor unit generated while the adjustment current is not being supplied to the magnetic field generating unit to adjust the reference voltage.

The adjusting unit may adjust the reference voltage based on a characteristic of the difference between the reference voltage and the output voltage of the sensor unit generated corresponding to the adjustment current.

The magnetic field measuring unit may integrate measurement values obtained in a predetermined period, and output the integrated measurement values.

Before measurement of a measurement-target magnetic field performed by the magnetic field measuring unit, the adjusting unit may make the reference voltage generating unit generate the reference voltage that makes the feedback current generating unit generate a reset magnetic field to magnetically saturate the magnetoresistive element.

Before measurement of a measurement-target magnetic field performed by the magnetic field measuring unit, the adjusting unit may: change a resistance value of a variable resistor provided in the reference voltage generating unit to make the reference voltage generating unit generate a reset magnetic field generating voltage that generates the reset magnetic field; and adjust the reference voltage based on the resistance value of the variable resistor that generates the reset magnetic field generating voltage.

The adjusting unit may adjust the reference voltage by using the resistance value of the variable resistor which is set to ½ to ¼ of a range of an upper reset magnetic field generating resistance value and a lower magnetic field generating resistance value each of which generates the reset magnetic field generating voltage.

An output voltage range of the reference voltage generating unit may be larger than an output voltage range of the sensor unit.

The magnetic field measuring device may further include a reset current generating unit that supplies, before measurement of a measurement-target magnetic field performed by the magnetic field measuring unit, the magnetic field generating unit with a reset current that generates a reset magnetic field to magnetically saturate the magnetoresistive element.

The magnetic field measuring device may further include a high-pass filter that allows passage therethrough of a high-frequency component of a measurement value output by the magnetic field measuring unit.

The feedback current generating unit may be formed by using two or more operational amplifiers.

The sensor unit may include a magnetic flux concentrating unit arranged adjacent to the magnetoresistive element, and the feedback current generating unit may be formed to surround the magnetoresistive element and the magnetic flux concentrating unit.

The magnetoresistive element may include a magnetization free layer, a non-magnetic layer, and a magnetization fixed layer that are stacked on a substrate in this order, and, when seen from above, the area of the magnetization fixed layer may be smaller than the area of the magnetization free layer, and a magnetosensitive area may be determined based on the area of the magnetization fixed layer.

The sensor unit may have a first magnetoresistive element and a second magnetoresistive element that are connected in series and have opposite polarity to each other, and a voltage across the first magnetoresistive element and the second magnetoresistive element may be output.

A second aspect of the present invention provides a magnetic field measurement method by which a magnetic field measuring device measures a magnetic field. The magnetic field measurement method may include: supplying, by the magnetic field measuring device and according to a difference between an output voltage of a sensor unit having at least one magnetoresistive element and a reference voltage output by a reference voltage generating unit, a magnetic field generating unit that generates a magnetic field to be applied to the sensor unit with a feedback current that generates a feedback magnetic field to diminish an input magnetic field to the sensor unit. The magnetic field measurement method may include outputting a measurement value corresponding to the feedback current by the magnetic field measuring device. The magnetic field measurement method may include adjusting, by the magnetic field measuring device, the reference voltage based on the output voltage of the sensor unit.

A third aspect of the present invention provides a recording medium having recorded thereon a magnetic field measurement program. The magnetic field measurement program may be executed by a computer. The magnetic field measurement program may make the computer function as a feedback current generating unit that supplies, according to a difference between an output voltage of a sensor unit having at least one magnetoresistive element and a reference voltage output by a reference voltage generating unit, a magnetic field generating unit that generates a magnetic field to be applied to the sensor unit with a feedback current that generates a feedback magnetic field to diminish an input magnetic field to the sensor unit. The magnetic field measurement program may make the computer function as a magnetic field measuring unit that outputs a measurement value corresponding to the feedback current. The magnetic field measurement program may make the computer function as an adjusting unit that uses the output voltage of the sensor unit to adjust the reference voltage.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
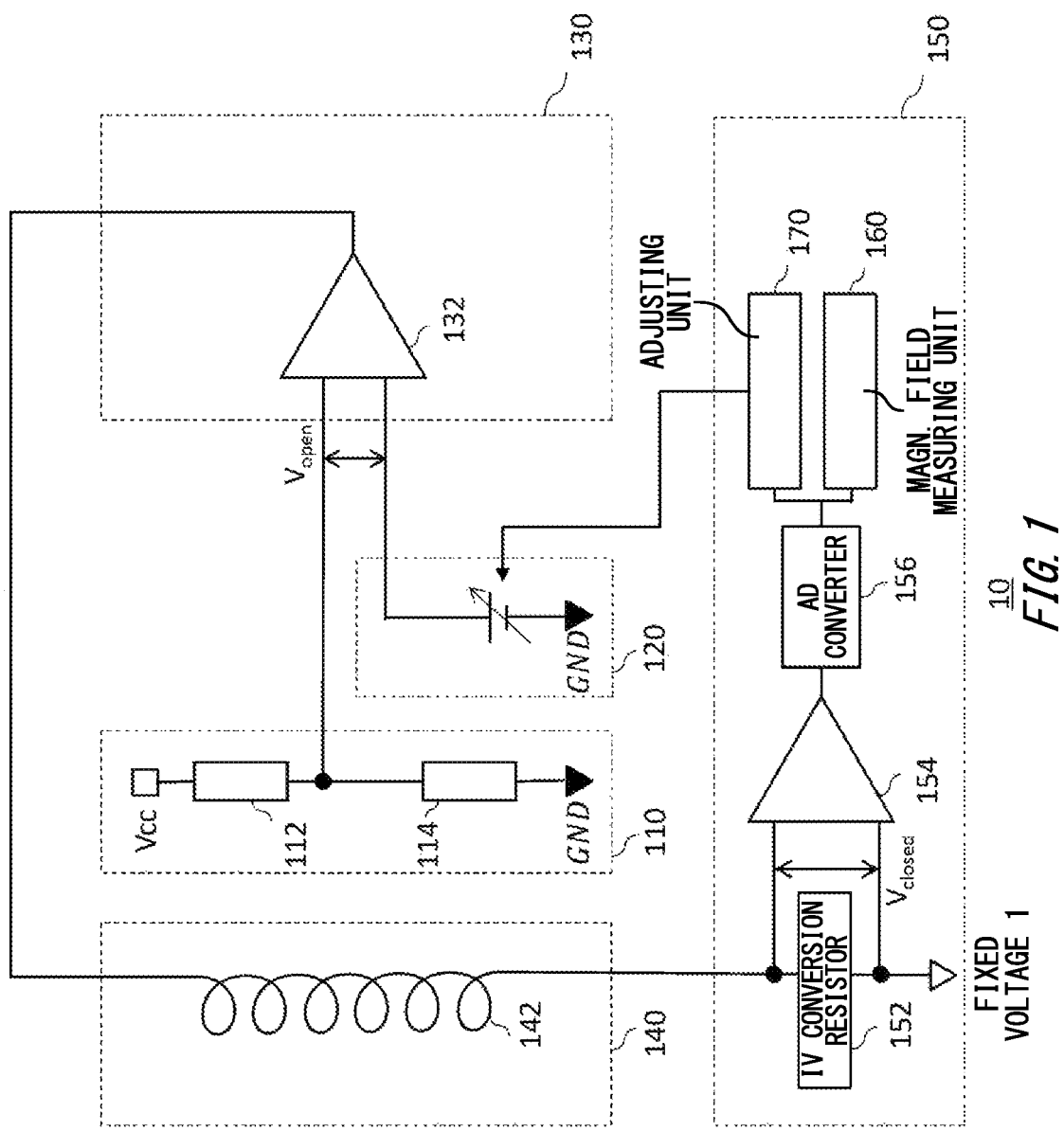
FIG. 1 illustrates the configuration of a magnetic field measuring device 10 according to the present embodiment.

FIG. 1 illustrates the configuration of a magnetic field measuring device 10 according to the present embodiment. The magnetic field measuring device 10 includes a sensor unit 110, a reference voltage generating unit 120, a feedback current generating unit 130, a magnetic field generating unit 140, and an operating unit 150.

The sensor unit 110 has at least one magnetoresistive element. Although for example the present embodiment illustrates an example the sensor unit 110 has a first magnetoresistive element 112 and a second magnetoresistive element 114 which are connected in series between power supply voltage Vcc and ground GND, and a voltage across the first magnetoresistive element 112 and the second magnetoresistive element 114 is output, instead of this, in the sensor unit 110, for example, one of the first magnetoresistive element 112 and the second magnetoresistive element 114 may be constituted by a fixed resistor. There are various possible aspects in which the sensor unit 110 outputs a voltage corresponding to a magnetic field input to at least one magnetoresistive element.

However, if the sensor unit 110 is configured to have the first magnetoresistive element 112 and the second magnetoresistive element 114 that are connected in series and have opposite polarity to each other, and to output a voltage across the first magnetoresistive element 112 and the second magnetoresistive element 114, this is more preferable since an effect of reducing variations of characteristics such as offset or sensitivity characteristics due to temperature can be attained. Here, having opposite polarity means that the resistance of a magnetoresistive element increases, and the resistance of the other magnetoresistive element decreases in response to magnetic fields input in the same direction.

The first magnetoresistive element 112, and the second magnetoresistive element 114 may be, for example, tunnel magneto-resistance (TMR) elements, giant magneto-resistance (GMR) elements, or the like.

The reference voltage generating unit 120 outputs a reference voltage. The reference voltage generating unit 120 is configured to be able to adjust the reference voltage to be output. The reference voltage generating unit 120 supplies the adjusted reference voltage to the feedback current generating unit 130.

The feedback current generating unit 130 supplies, according to the difference between the output voltage of the sensor unit 110 and the reference voltage output by the reference voltage generating unit 120, the magnetic field generating unit 140 with a feedback current that generates a feedback magnetic field to diminish an input magnetic field to the sensor unit 110. In the present embodiment, for example, the feedback current generating unit 130 has a first operational amplifier 132 that has two differential input terminals that are connected to the output voltage of the sensor unit 110 and the output of the reference voltage generating unit 120 (i.e., the reference voltage), respectively. Then, the first operational amplifier 132 generates a feedback current corresponding to the difference between the output voltage of the sensor unit 110 and the reference voltage, and supplies the feedback current to the magnetic field generating unit 140. Here, the difference between the output voltage of the sensor unit 110 and the reference voltage is defined as Vopen.

The magnetic field generating unit 140 generates a feedback magnetic field to be applied to the sensor unit 110. In the present embodiment, for example, the magnetic field generating unit 140 has a coil 142. If a feedback current is supplied from the feedback current generating unit 130, based on the supplied feedback current, the coil 142 generates a feedback magnetic field to be applied to the first magnetoresistive element 112 and second magnetoresistive element 114 provided in the sensor unit 110. Here, the sensor unit 110 (and the reference voltage generating unit 120) may be positioned to be enclosed by the coil 142.

The operating unit 150 has a current voltage conversion resistor 152, a second operational amplifier 154, an AD converter 156, a magnetic field measuring unit 160, and an adjusting unit 170, and performs various types of operations related to the magnetic field measuring device 10.

The current voltage conversion resistor 152 has one end connected to the magnetic field generating unit 140, and another end connected to a fixed voltage 1. The current voltage conversion resistor 152 converts a feedback current into a voltage, and generates, across its both ends, a voltage based on the feedback current (feedback current x resistance value of the current voltage conversion resistor 152). Here, the voltage based on the feedback current generated by the current voltage conversion resistor 152 is defined as Vclosed.

The second operational amplifier 154 has a differential input terminal connected to both ends of the current voltage conversion resistor 152, and outputs a voltage VAMP corresponding to the voltage across both ends of the current voltage conversion resistor 152, that is, the voltage Vclosed.

The AD converter 156 is connected to the second operational amplifier 154, and converts, into a digital value VADC, the analog voltage value VAMP corresponding to the voltage Vclosed output by the second operational amplifier 154.

In a measurement phase, the magnetic field measuring unit 160 outputs a measurement value corresponding to the feedback current. In the present embodiment, for example, the magnetic field measuring unit 160 is connected to the AD converter 156, and outputs a measurement value based on the digital value VADC that is obtained through conversion by the AD converter 156 and corresponds to the voltage Vclosed.

In an adjustment phase, the adjusting unit 170 uses the output voltage of the sensor unit 110 to adjust the reference voltage output by the reference voltage generating unit 120. This is described below. Note that although the explanation described above illustrated an example in which the magnetic field measuring unit 160 and the adjusting unit 170 are configured as separate functional units, the magnetic field measuring unit 160 and the adjusting unit 170 may be configured as an integrated functional unit.

By using the magnetic field measuring device 10 according to the present embodiment, if a measurement-target magnetic field is input to the sensor unit 110, the feedback current generating unit 130 generates a feedback current corresponding to the difference between the reference voltage and the output voltage of the sensor unit 110 generated corresponding to the measurement-target magnetic field (that is, the voltage Vopen), and supplies the feedback current to the magnetic field generating unit 140. Then, according to the supplied feedback current, the magnetic field generating unit 140 generates a feedback magnetic field to cancel out the measurement-target magnetic field input to the sensor unit 110. Then, in a measurement phase, the magnetic field measuring unit 160 outputs a measurement value corresponding to the feedback current generated for the measurement-target magnetic field, specifically, a digital value VADC corresponding to the voltage Vclosed. Here, this series of control is defined as closed-loop control. Note that under the closed-loop control, control is performed such that the value of the voltage Vopen becomes 0, that is, a feedback magnetic field to cancel out an input magnetic field is generated.

Figure 2:
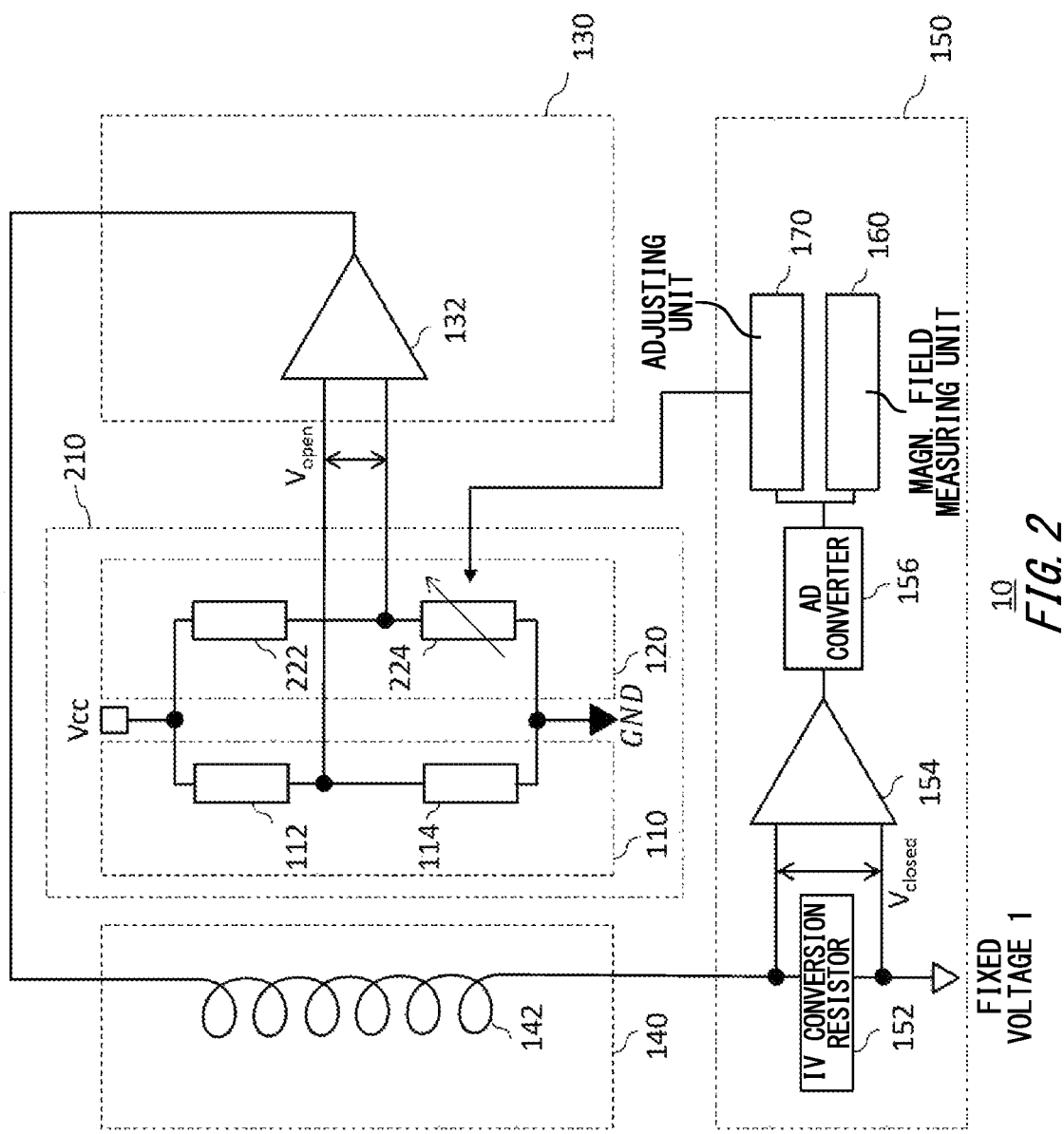
FIG. 2 illustrates an example of the magnetic field measuring device 10 according to the present embodiment in which a reference voltage generating unit 120 has at least one variable resistor.

FIG. 2 illustrates an example of the magnetic field measuring device 10 according to the present embodiment in which the reference voltage generating unit 120 has at least one variable resistor. As illustrated in this figure, the reference voltage generating unit 120 has at least one variable resistor. For example, the reference voltage generating unit 120 may be configured to have a fixed resistor 222 and a variable resistor 224 connected in series between the power supply voltage Vcc and the ground GND, and output a voltage across the fixed resistor 222 and the variable resistor 224 as the reference voltage. In addition, as illustrated in this figure, the first magnetoresistive element 112, and second magnetoresistive element 114 provided in the sensor unit 110, and the fixed resistor 222 and variable resistor 224 provided in the reference voltage generating unit 120 may constitute a bridge circuit 210. Other than this, the reference voltage generating unit 120 may have, as the fixed resistor 222, a magnetoresistive element having the same polarity as the second magnetoresistive element 114 (polarity opposite to the first magnetoresistive element 112), and have, as the variable resistor 224, a configuration in which a variable resistor and a magnetoresistive element having the same polarity as the first magnetoresistive element 112 (polarity opposite to the second magnetoresistive element 114) are connected in series. If the reference voltage generating unit 120 has a variable resistor, the adjusting unit 170 changes the resistance value of the variable resistor to adjust the reference voltage output by the reference voltage generating unit 120 (the reference voltage as a voltage obtained through resistive division).

Figure 3:
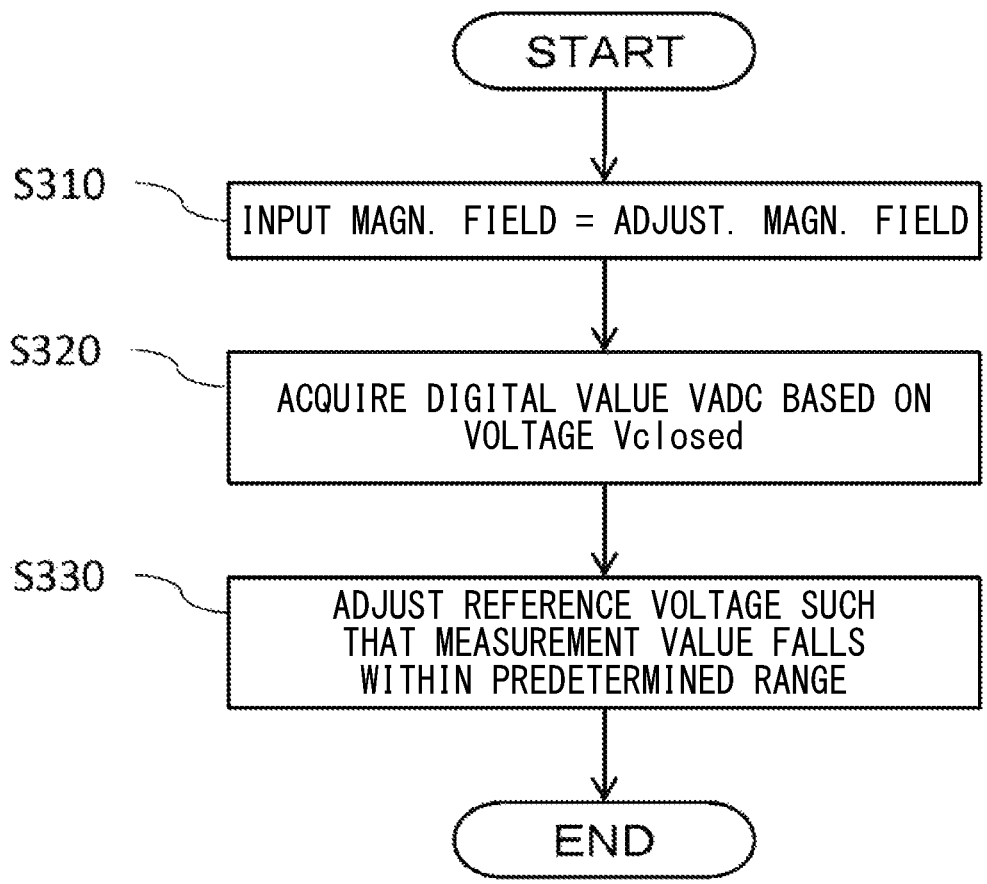
FIG. 3 illustrates a first exemplary flow of magnetic operating point adjustment performed by the magnetic field measuring device 10 according to the present embodiment.

FIG. 3 illustrates a first exemplary flow of magnetic operating point adjustment performed by the magnetic field measuring device 10 according to the present embodiment. The magnetic operating point is defined as the total of magnetic fields input to magnetoresistive elements constituting the magnetic field measuring device 10 according to the present embodiment. At Step 310, for example, a measurer sets an input magnetic field to be input to the sensor unit 110 to an adjustment magnetic field having a value predetermined for performing magnetic operating point adjustment. Here, the adjustment magnetic field may have any value within a magnetic field range that the sensor unit 110 can perform magnetic detection. In the example explained below, there are no applied adjustment magnetic fields. If there are no applied adjustment magnetic fields, for example, a measurer places the magnetic field measuring device 10 according to the present embodiment in a magnetic shield room or a portable magnetic shield box to thereby shield the magnetic field measuring device 10 from environmental magnetic fields such as the geomagnetic field such that there are no applied input magnetic fields input to the sensor unit 110.

Next, at Step 320, the adjusting unit 170 acquires the digital value VADC that is based on the voltage Vclosed in the state where an adjustment magnetic field having a predetermined value is being input to the sensor unit 110.

Then, at Step 330, the adjusting unit 170 adjusts the reference voltage output by the reference voltage generating unit 120 based on a feedback current. In this flow, upon the sensor unit 110 receiving an adjustment magnetic field, the adjusting unit 170 adjusts the reference voltage output by the reference voltage generating unit 120 such that the digital value VADC that is based on a measurement value, for example, the voltage Vclosed, falls within a predetermined range of values as a result of the reception of the adjustment magnetic field, and the adjusting unit 170 ends the process. For example, the adjusting unit 170 adjusts the reference voltage output by the reference voltage generating unit 120 such that, for example, the digital value VADC that is based on the voltage Vclosed becomes equal to or smaller than a predetermined threshold so as to make the voltage Vclosed 0 if there are no applied adjustment magnetic fields input to the sensor unit 110. Note that if there is an applied adjustment magnetic field, the adjusting unit 170 adjusts the reference voltage output by the reference voltage generating unit 120 such that the voltage Vclosed becomes a value corresponding to the strength of the adjustment magnetic field. Note that in the closed loop, a voltage Vclosed and a voltage VAMP correspond to each other uniquely, and may be treated as equivalent physical quantities.

Figure 4:
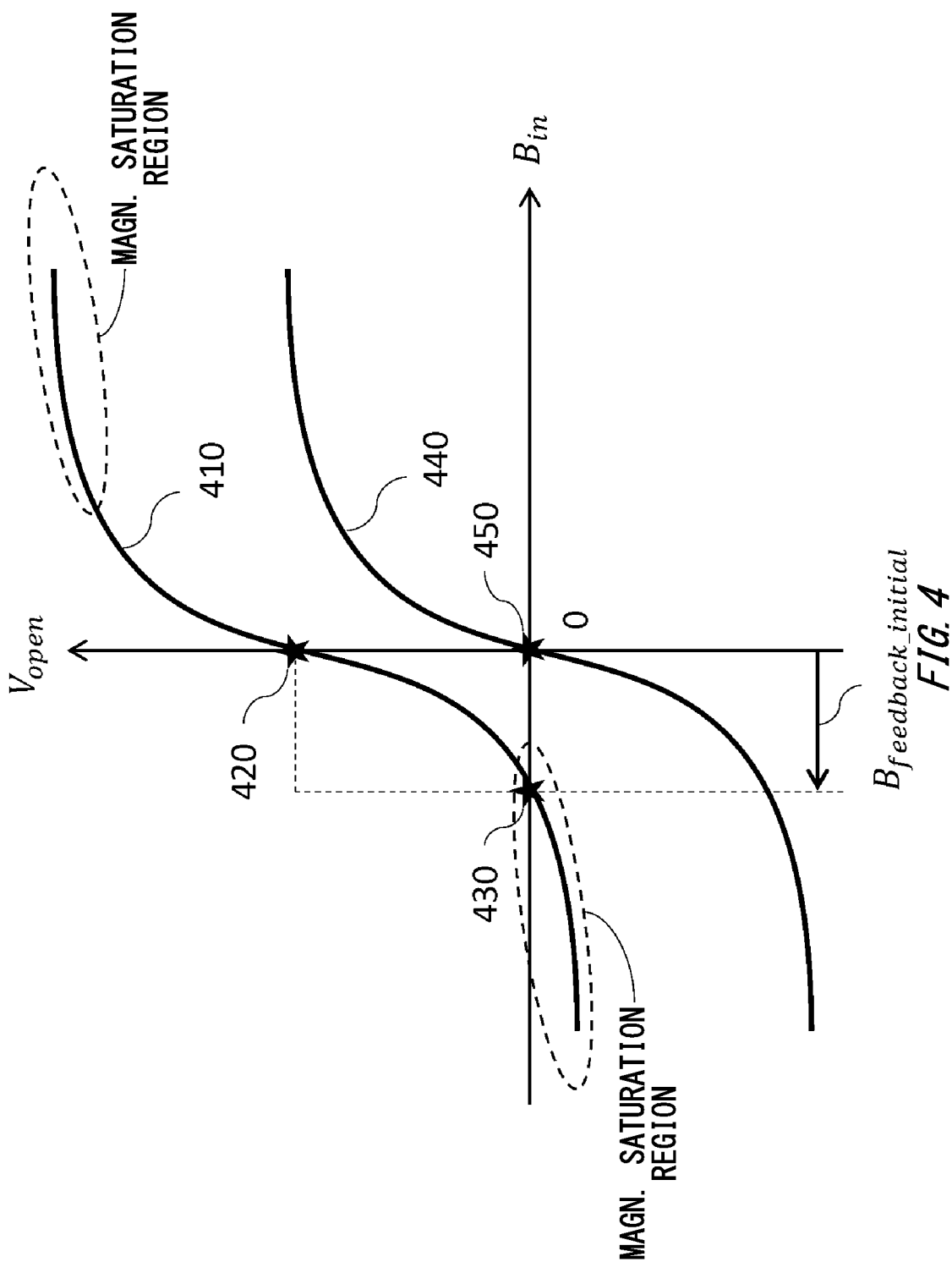
FIG. 4 illustrates characteristics of voltage Vopen generated corresponding to an input magnetic field Bin before and after magnetic operating point adjustment performed by the magnetic field measuring device 10 according to the present embodiment based on the flow illustrated in FIG. 3.

FIG. 4 illustrates characteristics of voltage Vopen generated corresponding to an input magnetic field Bin before and after magnetic operating point adjustment performed by the magnetic field measuring device 10 according to the present embodiment based on the flow illustrated in FIG. 3. A curve 410 illustrates characteristics of the voltage Vopen generated corresponding to the input magnetic field Bin to the sensor unit 110 before magnetic operating point adjustment based on the flow illustrated in FIG. 3. For example, if there are no applied input magnetic fields Bin to the sensor unit 110, the value of Vopen should be 0 provided that the output voltage of the sensor unit 110 and the reference voltage are ideally the same value. However, the output voltage of the sensor unit 110 and the reference voltage output by the reference voltage generating unit 120 do not necessarily become ideally the same value due to fluctuations in element formation processes of the first magnetoresistive element 112 and second magnetoresistive element 114 provided in the sensor unit 110, and the fixed resistor 222 and variable resistor 224 provided in the reference voltage generating unit 120, and the like, for example. As a result, even if there are no applied input magnetic fields Bin, the value of the voltage Vopen does not become 0, and may assume a finite value (defined as "Vinitial") as illustrated by a point 420, for example. The magnetic operating point at this time is the point 420.

If the closed-loop control is performed in this state, the feedback current generating unit 130 generates a feedback current Ifeedback_initial corresponding to the voltage Vinitial, and supplies the feedback current Ifeedback_initial to the magnetic field generating unit 140. Then, based on this feedback current Ifeedback_initial, the magnetic field generating unit 140 generates a feedback magnetic field Bfeedback_initial so as to make the voltage Vopen 0. That is, due to the feedback magnetic field Bfeedback_initial, the voltage Vopen becomes 0, and the magnetic operating point transitions from the point 420 to a point 430. If the magnetic field measuring device 10 measures a measurement-target magnetic field in this state, the first magnetoresistive element 112 and the second magnetoresistive element 114 perform measurement of the magnetic field while the magnetic operating point is at the point 430.

However, characteristics of the voltage Vopen generated corresponding to the input magnetic field Bin have magnetic saturation regions as illustrated in FIG. 4, in accordance with the magnetic saturation characteristics of the first magnetoresistive element 112 and second magnetoresistive element 114 provided in the sensor unit 110. Then, the first magnetoresistive element 112 and the second magnetoresistive element 114, if operated in the magnetic saturation regions or nearby regions, become unable to achieve a high magnetic sensitivity (the rate of change of the voltage Vopen in response to the magnetic field Bin), and to detect a weak measurement-target magnetic field. In view of this, in an adjustment phase before a measurement phase, the magnetic field measuring device 10 in the present embodiment adjusts the magnetic operating point of the first magnetoresistive element 112 and the second magnetoresistive element 114 to thereby make it possible for the first magnetoresistive element 112 and the second magnetoresistive element 114 to operate at a point where they can achieve a relatively high magnetic sensitivity, that is, a high magnetic resolution.

A curve 440 illustrates characteristics of the voltage Vopen generated corresponding to the input magnetic field Bin to the sensor unit 110 after magnetic operating point adjustment based on the flow illustrated in FIG. 3. The magnetic field measuring device 10 according to the present embodiment performs magnetic operating point adjustment based on the flow illustrated in FIG. 3 to thereby be able to cause a transition of the operating point of the first magnetoresistive element 112 and the second magnetoresistive element 114 from the point 430 to a point 450. This point 450 is a point where the voltage Vclosed becomes 0, that is, the feedback current becomes 0 if there are no applied input magnetic fields Bin, and, if the first magnetoresistive element 112 and the second magnetoresistive element 114 are operated at this point, the highest magnetic sensitivity can be achieved.

In a conventional magnetic sensor that uses a bridge circuit constituted by one TMR element and three fixed resistors, the magnetic operating point of the TMR element is positioned in a magnetic saturation region where the magnetic sensitivity is lowered due to fluctuations in element formation processes of the TMR element and the fixed resistors, and the like in some cases. In contrast to this, the magnetic field measuring device 10 of the present embodiment can cause a transition of the magnetic operating point of the first magnetoresistive element 112 and the second magnetoresistive element 114 to a point where the magnetic sensitivity is relatively high, and can detect a weaker measurement-target magnetic field as a signal.

Figure 5:
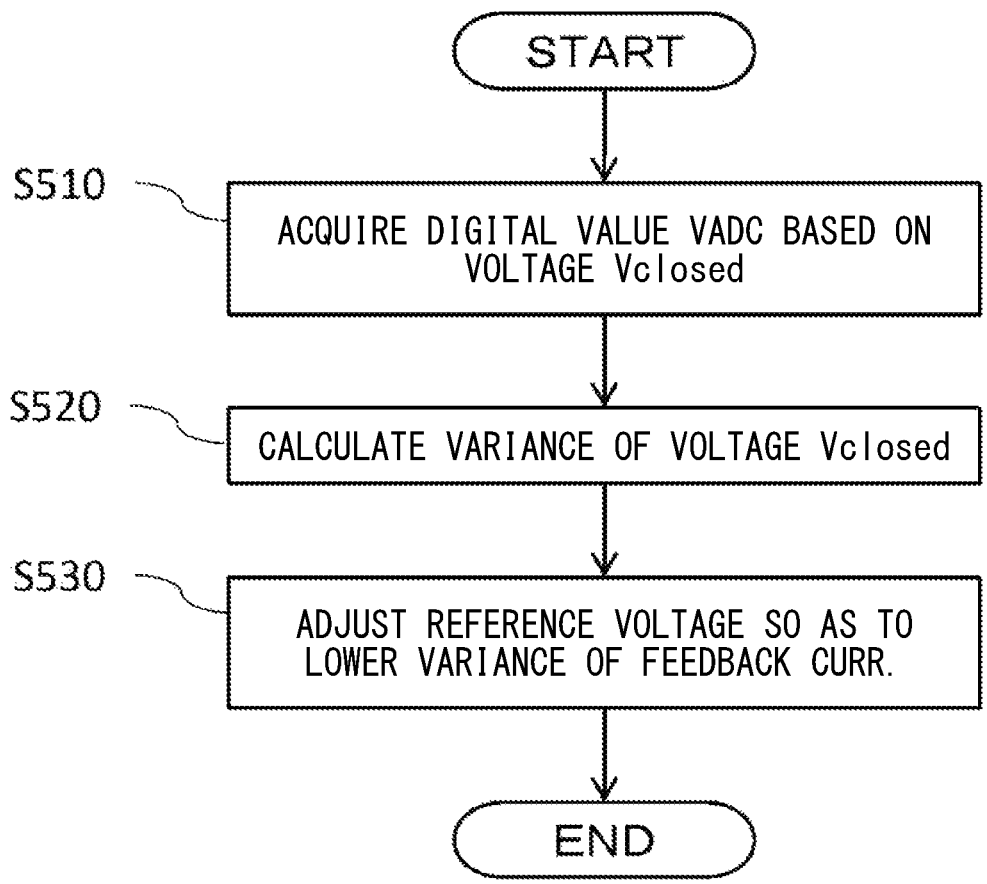
FIG. 5 illustrates a second exemplary flow of magnetic operating point adjustment performed by the magnetic field measuring device 10 according to the present embodiment.

FIG. 5 illustrates a second exemplary flow of magnetic operating point adjustment performed by the magnetic field measuring device 10 according to the present embodiment. In the magnetic operating point adjustment in this flow, the input magnetic field Bin to be input to the sensor unit 110 needs not be set to an adjustment magnetic field having a predetermined value, unlike the magnetic operating point adjustment in the flow illustrated in FIG. 3. That is, for example, a measurer needs not to place the magnetic field measuring device 10 in a shield room or a portable shield box such that there are no applied input magnetic fields input to the sensor unit 110. At Step 510, the adjusting unit 170 acquires the digital value VADC that is based on the voltage Vclosed. Note that the input magnetic field input to the sensor unit 110 at this time point has not a predetermined known value, but an unknown value, as mentioned above.

Next, at Step 520, the adjusting unit 170 calculates the variance of the voltage Vclosed acquired at Step 510. Here, a variance indicates the magnitude of fluctuations of values that the voltage Vclosed can assume in a predetermined period. For example, the adjusting unit 170 may acquire values of the voltage Vclosed in a predetermined period, calculate their average value, square the difference between the value of each Vclosed and the average value, and take the average of the thus-obtained values to thereby calculate the variance of the voltage Vclosed.

Then, at Step 530, the adjusting unit 170 adjusts the reference voltage output by the reference voltage generating unit 120 so as to lower the variance of the voltage Vclosed, and ends the process. For example, the adjusting unit 170 adjusts the reference voltage output by the reference voltage generating unit 120 so as to minimize the variance of the voltage Vclosed calculated at Step 520. Note that since the voltage Vclosed is a voltage obtained through conversion of a feedback current via the current voltage conversion resistor 152, minimizing the variance of the voltage Vclosed corresponds to minimizing the variance of the feedback current.

Figure 6:
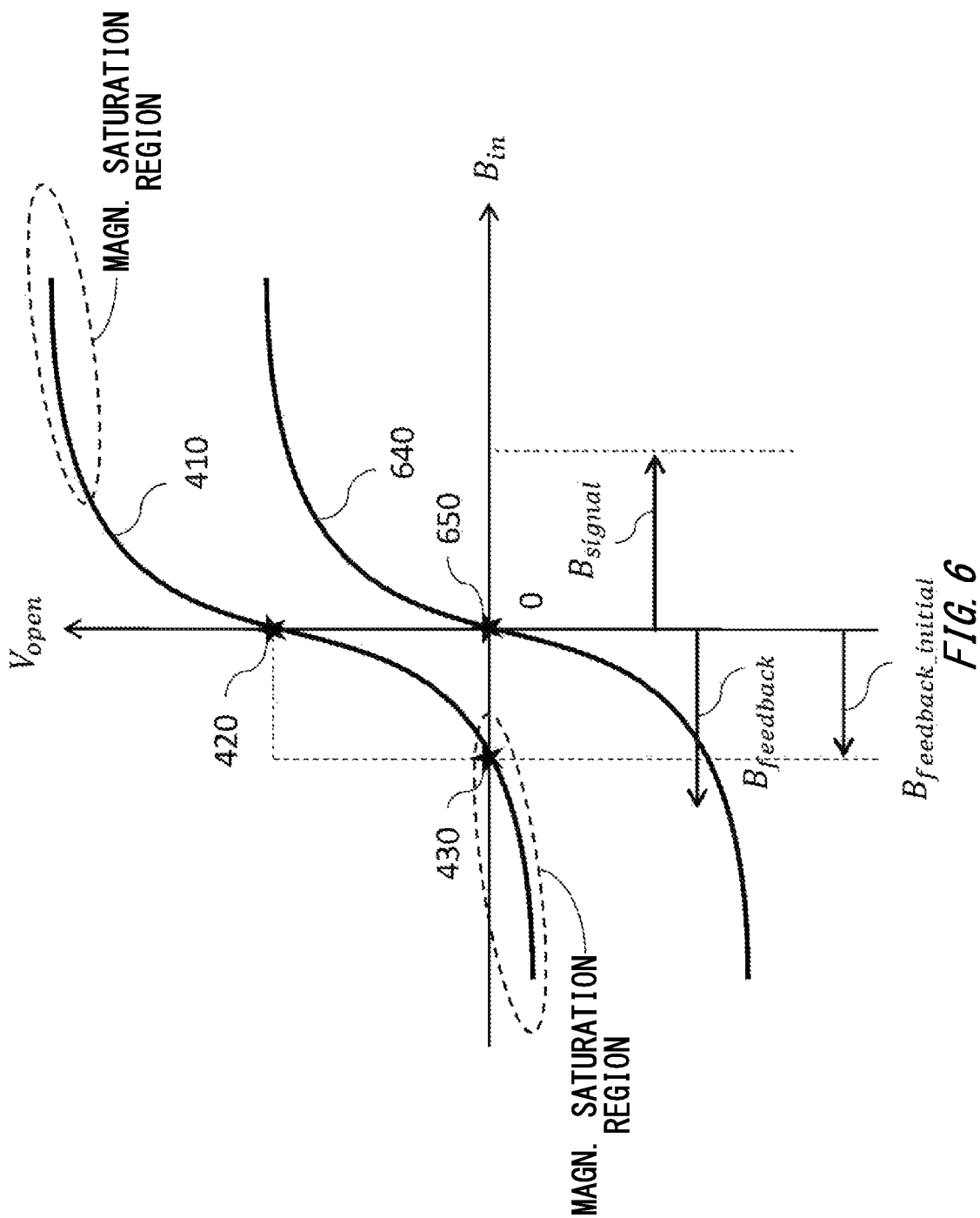
FIG. 6 illustrates characteristics of voltage Vopen generated corresponding to an input magnetic field Bin before and after magnetic operating point adjustment performed by the magnetic field measuring device 10 according to the present embodiment based on the flow illustrated in FIG. 5.

FIG. 6 illustrates characteristics of voltage Vopen generated corresponding to an input magnetic field Bin before and after magnetic operating point adjustment performed by the magnetic field measuring device 10 according to the present embodiment based on the flow illustrated in FIG. 5. Since explanations similar to those related to FIG. 4 apply to portions given the same symbols as those illustrated in FIG. 4, those explanations are omitted. A difference from FIG. 4 is that the input magnetic field Bin input to the sensor unit 110 has not a known value, but a finite unknown value (defined as "Bsignal").

If the closed-loop control is performed in this state, the feedback current generating unit 130 generates the feedback current Ifeedback for cancelling out a magnetic field Bsignal in addition to the feedback current Ifeedback_initial corresponding to the voltage Vinitial, and supplies them to the magnetic field generating unit 140. Then, based on these feedback currents, the magnetic field generating unit 140 generates the feedback magnetic field Bfeedback_initial so as to make the voltage Vopen 0, and also generates the feedback magnetic field Bfeedback so as to cancel out the magnetic field Bsignal. In this case also, the magnetic operating point of the first magnetoresistive element 112 and the second magnetoresistive element 114 is the point 430, similar to FIG. 4. Here, the adjusting unit 170 adjusts the reference voltage output by the reference voltage generating unit 120 so as to adjust the magnetic operating point of the first magnetoresistive element 112 and the second magnetoresistive element 114 based on the feedback currents, but the adjusting unit 170 cannot distinguish between the feedback currents, Ifeedback_initial and Ifeedback.

In view of this, in the present embodiment, the adjusting unit 170 adjusts the reference voltage based on the variance of the voltage Vclosed. Typically, since as the magnetic operating point of a magnetoresistive element approaches a magnetic saturation point, the magnetic sensitivity lowers, it has characteristics that the ratio of fluctuations of output to the magnetic sensitivity (uncertainty of output) increases (that is, the signal noise ratio in magnetic detection lowers) as the magnetic operating point approaches a magnetic saturation point. Then, since in the present embodiment, the feedback currents generated by the feedback current generating unit 130 are based on the output voltage of the sensor unit 110 having the first magnetoresistive element 112 and the second magnetoresistive element 114, they reflect the signal noise ratio in magnetic detection by the first magnetoresistive element 112 and the second magnetoresistive element 114. For example, since as the magnetic operating point of the first magnetoresistive element 112 and the second magnetoresistive element 114 approaches a magnetic saturation point, the signal noise ratio lowers, fluctuations of the feedback currents increase following the lowering signal noise ratio. Accordingly, if the reference voltage is adjusted so as to reduce fluctuations of the feedback currents, it becomes possible to cause a transition of the magnetic operating point of the first magnetoresistive element 112 and the second magnetoresistive element 114 to a point farthest from a magnetic saturation point, that is, a point at which they can have the highest magnetic sensitivity. Utilizing this principle, the adjusting unit 170 adjusts the reference voltage output by the reference voltage generating unit 120 so as to reduce the variance of the voltage Vclosed reflecting the variance of the feedback currents, and causes a transition of the magnetic operating point of the first magnetoresistive element 112 and the second magnetoresistive element 114 to a point where they can have a relatively high magnetic sensitivity.

A curve 640 illustrates characteristics of the voltage Vopen generated corresponding to the input magnetic field Bin to the sensor unit 110 after magnetic operating point adjustment based on the flow illustrated in FIG. 5. The magnetic field measuring device 10 according to the present embodiment performs magnetic operating point adjustment based on the flow illustrated in FIG. 5 to thereby be able to cause a transition of the magnetic operating point of the first magnetoresistive element 112 and the second magnetoresistive element 114 from the point 430 to a point 650. This point 650 is a point where the variance of the voltage Vclosed becomes the smallest, that is, the variance of the feedback current becomes the smallest, and, if the first magnetoresistive element 112 and the second magnetoresistive element 114 are operated at this point, the highest magnetic sensitivity can be achieved.

Although the explanation described above illustrated as an example a technique of lowering the variance of the voltage Vclosed reflecting the variance of the feedback current, this is not the sole example. For example, instead of lowering the variance of the voltage Vclosed, the magnetic field measuring device 10 may adjust the reference voltage so as to lower the peak-to-peak value of the signal amplitude of the voltage Vclosed. Alternatively, for example, the magnetic field measuring device 10 may use a signal analyser (or a FFT analyzer, etc.) on measurement data of the voltage Vclosed along the time axis to monitor the signal-strength frequency dependence (e.g., the frequency dependence of the electrical power density, etc.) of the voltage Vclosed. Then, since this signal-strength frequency dependence of the voltage Vclosed represents the signal-strength frequency dependence of fluctuations of output of the magnetoresistive elements, the magnetic field measuring device 10 may adjust the reference voltage so as to lower the degree of the signal-strength frequency dependence of the fluctuations. Note that this technique of analyzing the frequency dependence can be performed by using not a signal analyser, but a processor such as a microcomputer.

Figure 7:
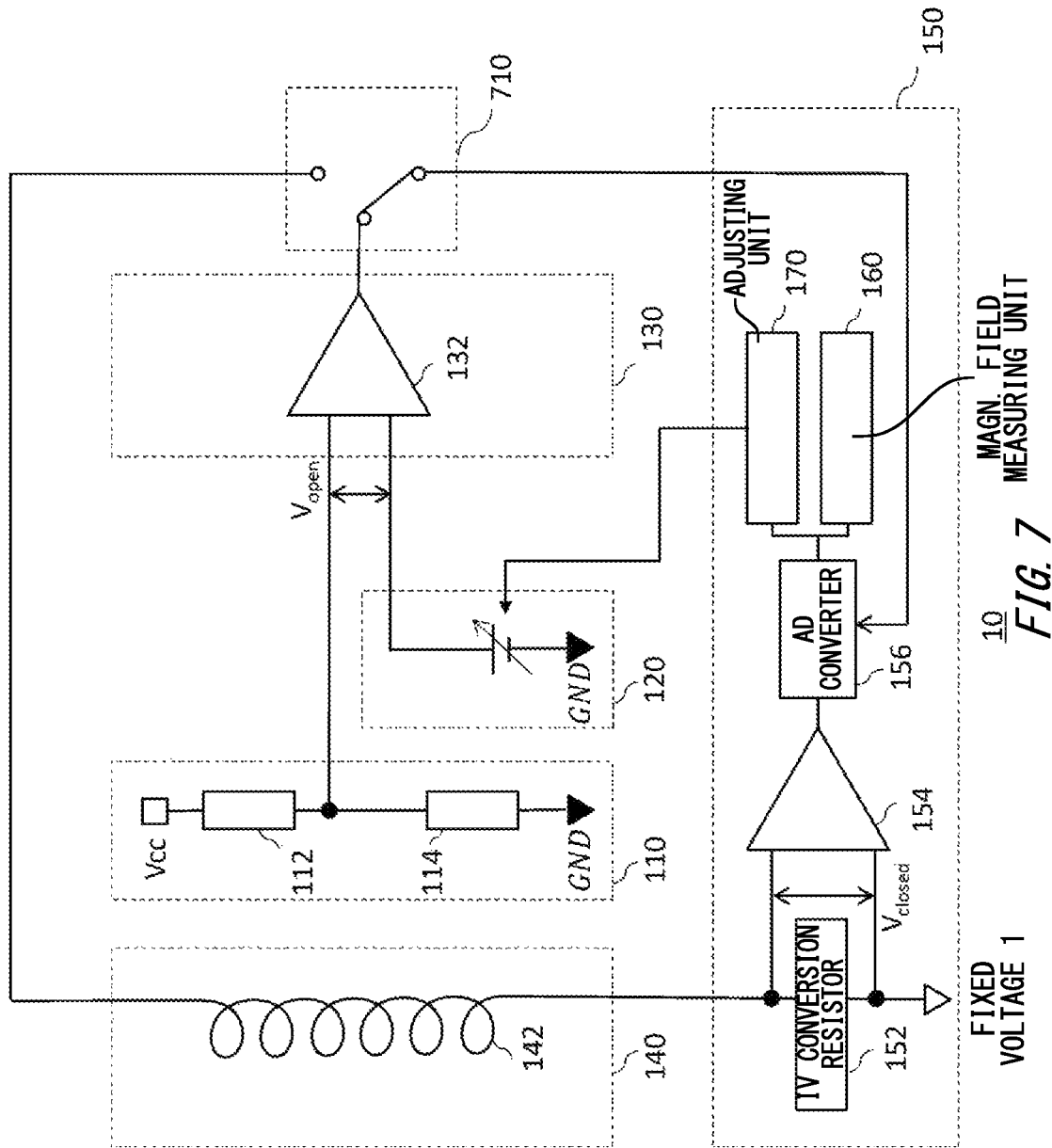
FIG. 7 illustrates the configuration of the magnetic field measuring device 10 provided with a switching unit 710 according to a variant of the magnetic field measuring device 10 of the present embodiment.

FIG. 7 illustrates the configuration of the magnetic field measuring device 10 provided with a switching unit 710 according to a variant of the magnetic field measuring device 10 of the present embodiment. The magnetic field measuring device 10 illustrated in this figure further includes the switching unit 710 in addition to the configurations of the magnetic field measuring device 10 illustrated in FIG. 1. The switching unit 710 is provided between the feedback current generating unit 130 and the magnetic field generating unit 140, and can switch whether to or not to supply a feedback current generated by the feedback current generating unit 130 to the magnetic field generating unit 140. In addition, the switching unit 710 can supply output of the feedback current generating unit 130 to the AD converter 156 if a feedback current is not supplied to the magnetic field generating unit 140. In this case, the adjusting unit 170 uses the output voltage of the sensor unit 110 in the state where a feedback current is not being supplied to the magnetic field generating unit 140 to adjust the reference voltage output by the reference voltage generating unit 120.

Figure 8:
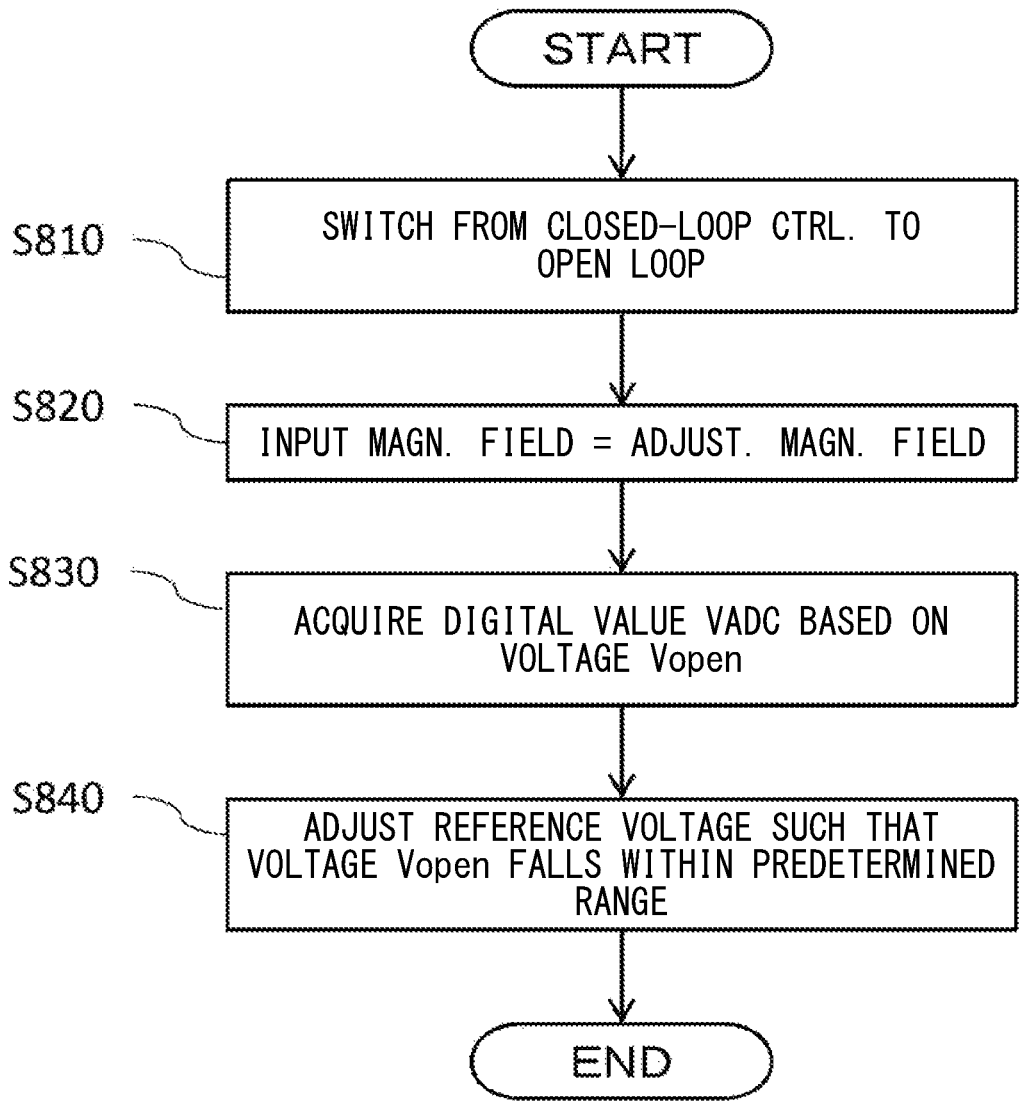
FIG. 8 illustrates a third exemplary flow of magnetic operating point adjustment performed by the magnetic field measuring device 10 illustrated in FIG. 7.

FIG. 8 illustrates a third exemplary flow of magnetic operating point adjustment performed by the magnetic field measuring device 10 illustrated in FIG. 7. Here, the state where the closed-loop control is not being performed is defined as an open loop. At Step 810, the switching unit 710 switches the state of control from the closed-loop control to the state where a feedback current is not supplied to the magnetic field generating unit 140, that is, the open loop. In addition, the switching unit 710 supplies output of the feedback current generating unit 130 to the AD converter 156.

At Step 820, similar to step 310 illustrated in FIG. 3, for example, a measurer sets an input magnetic field to be input to the sensor unit 110 to an adjustment magnetic field having a value predetermined for performing magnetic operating point adjustment. Note that in this case also, preferably there are no applied adjustment magnetic fields. In the example explained below, there are no applied adjustment magnetic fields.

Next, at Step 830, the adjusting unit 170 acquires the value of the voltage Vopen in the state where an adjustment magnetic field having a predetermined value is being input to the sensor unit 110. For example, through digital conversion of output of the feedback current generating unit 130 by the AD converter 156, the adjusting unit 170 acquires a digital value VADC that is based on the voltage Vopen. Note that in the open loop, a voltage Vopen and a digital value VADC correspond to each other uniquely, and may be treated as equivalent physical quantities.

Then, at Step 840, upon the sensor unit 110 receiving an adjustment magnetic field while the feedback currents are not being supplied to the magnetic field generating unit 140, the adjusting unit 170 adjusts the reference voltage output by the reference voltage generating unit 120 such that the voltage Vopen which is the difference between the output voltage of the sensor unit 110 and the reference voltage output by the reference voltage generating unit 120 falls within a determined range as a result of the reception of the adjustment magnetic field, and ends the process. For example, the adjusting unit 170 adjusts the reference voltage output by the reference voltage generating unit 120 such that, for example, the absolute value of the voltage Vopen becomes equal to or smaller than a predetermined threshold so as to make the voltage Vopen 0 if there are no applied adjustment magnetic fields input to the sensor unit 110.

Figure 9:
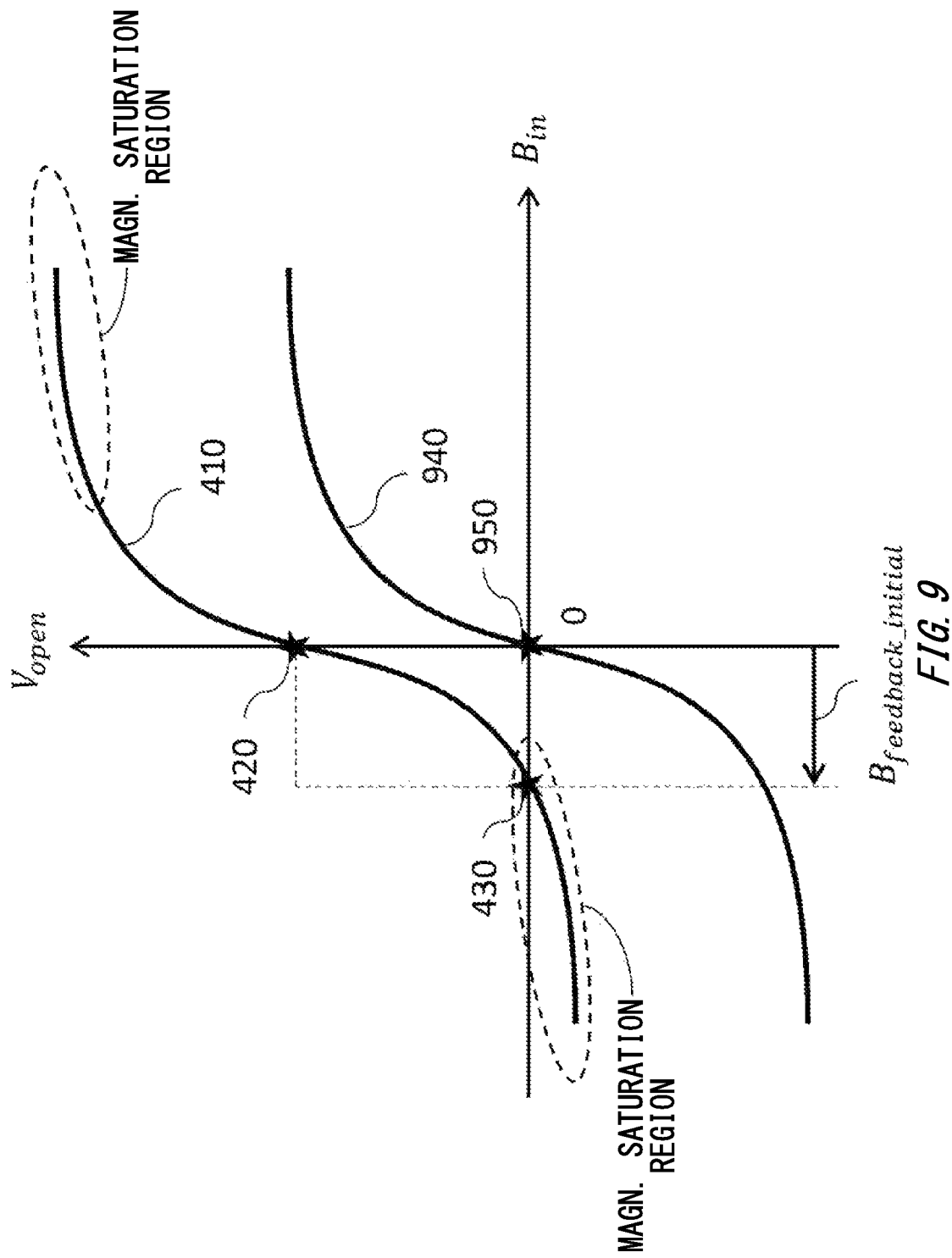
FIG. 9 illustrates characteristics of voltage Vopen generated corresponding to an input magnetic field Bin before and after magnetic operating point adjustment performed by the magnetic field measuring device 10 illustrated in FIG. 7 based on the flow illustrated in FIG. 8.

FIG. 9 illustrates characteristics of voltage Vopen generated corresponding to an input magnetic field Bin before and after magnetic operating point adjustment performed by the magnetic field measuring device 10 illustrated in FIG. 7 based on the flow illustrated in FIG. 8. Since explanations similar to those related to FIG. 4 apply to portions given the same symbols as those illustrated in FIG. 4, those explanations are omitted. A difference from FIG. 4 is that the magnetic field measuring device 10 performs magnetic operating point adjustment in the open loop.

Since, if the switching unit 710 switches the state of control from the closed-loop control to the open loop, the feedback magnetic field Bfeedback_initial is no longer generated, the magnetic operating point of the first magnetoresistive element 112 and the second magnetoresistive element 114 transitions from the point 430 to the point 420. In this state, for example, the adjusting unit 170 adjusts the reference voltage output by the reference voltage generating unit 120 so as to make the voltage Vopen 0 if there are no applied input magnetic fields input to the sensor unit 110. A curve 940 illustrates characteristics of the voltage Vopen generated corresponding to the input magnetic field Bin to the sensor unit 110 after magnetic operating point adjustment based on the flow illustrated in FIG. 8. The magnetic field measuring device 10 illustrated in FIG. 7 performs magnetic operating point adjustment based on the flow illustrated in FIG. 8 to thereby be able to cause a transition of the magnetic operating point of the first magnetoresistive element 112 and the second magnetoresistive element 114 from the point 420 to a point 950. This point 950 is a point where the voltage Vopen becomes 0 when there are no applied input magnetic fields Bin, and if the magnetic field measuring device 10 illustrated in FIG. 7 switches the state of control from the open loop to the closed loop in this state, and operates the first magnetoresistive element 112 and the second magnetoresistive element 114, the highest magnetic sensitivity can be attained.

Figure 10:
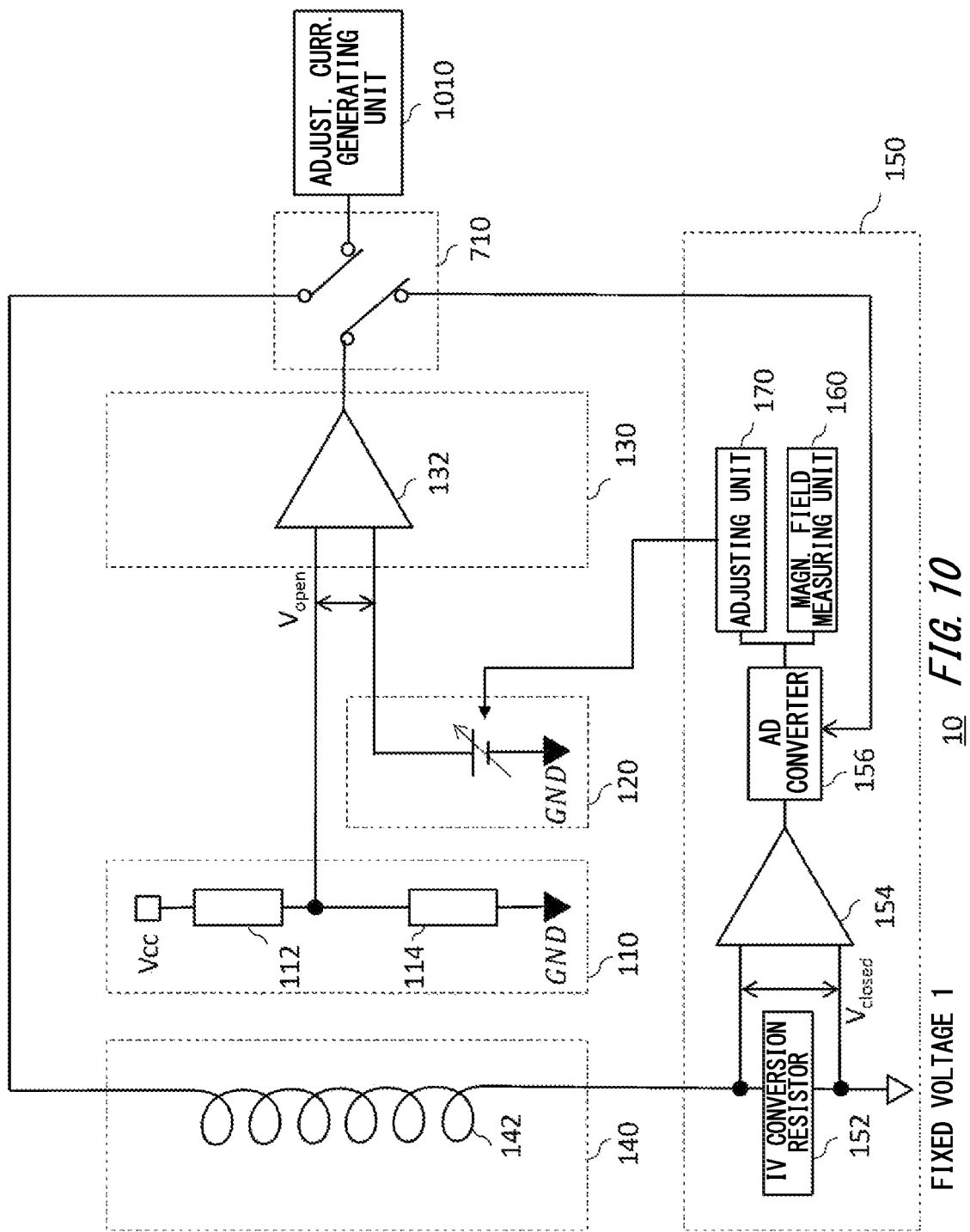
FIG. 10 illustrates the configuration of the magnetic field measuring device 10 provided with the switching unit 710 and an adjustment current generating unit 1010 according to a variant of the magnetic field measuring device 10 of the present embodiment.

FIG. 10 illustrates the configuration of the magnetic field measuring device 10 provided with the switching unit 710 and an adjustment current generating unit 1010 according to a variant of the magnetic field measuring device 10 of the present embodiment. The magnetic field measuring device 10 illustrated in this figure further includes the adjustment current generating unit 1010 in addition to the configurations of the magnetic field measuring device 10 illustrated in FIG. 7. The adjustment current generating unit 1010 generates an adjustment current Iadjust. In addition, the switching unit 710 of the magnetic field measuring device 10 in this figure can supply output of the feedback current generating unit 130 to the AD converter 156 if a feedback current is not supplied to the magnetic field generating unit 140, and also make the magnetic field generating unit 140 connected to the adjustment current generating unit 1010 to supply an adjustment current to the magnetic field generating unit 140. In this case, the adjusting unit 170 uses the output voltage of the sensor unit 110 in the state where an adjustment current is being supplied to the magnetic field generating unit 140 to adjust the reference voltage output by the reference voltage generating unit 120.

Figure 11:
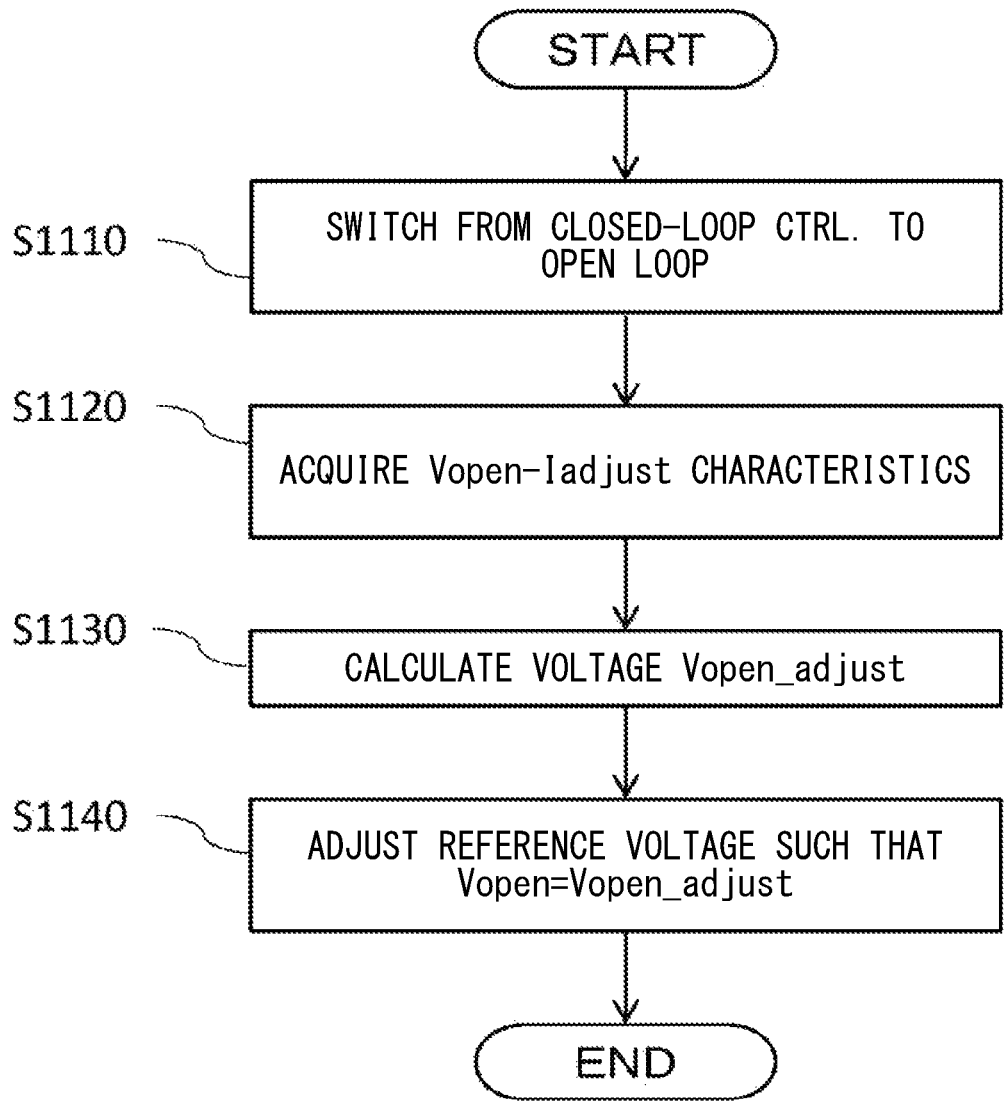
FIG. 11 illustrates a fourth exemplary flow of magnetic operating point adjustment performed by the magnetic field measuring device 10 illustrated in FIG. 10.

FIG. 11 illustrates a fourth exemplary flow of magnetic operating point adjustment performed by the magnetic field measuring device 10 illustrated in FIG. 10. At Step 1110, similar to Step 810, the switching unit 710 switches the state of control from the closed-loop control to the open loop. In addition, the switching unit 710 supplies output of the feedback current generating unit 130 to the AD converter 156, and also make the magnetic field generating unit 140 connected to the adjustment current generating unit 1010 to supply an adjustment current to the magnetic field generating unit 140.

At Step 1120, the adjusting unit 170 sequentially acquires values of the voltage Vopen while changing the magnitude of the adjustment current Iadjust generated by the adjustment current generating unit 1010, and acquires characteristics of the voltage Vopen (Vopen-Iadjust characteristics) generated corresponding to the adjustment current Iadjust.

At Step 1130, the adjusting unit 170 calculates a voltage Vopen_adjust from the characteristics of the voltage Vopen generated corresponding to the adjustment current that are acquired at Step 1120. A method of calculating the voltage Vopen_adjust is described below.

At Step 1140, the adjusting unit 170 adjusts the reference voltage output by the reference voltage generating unit 120 based on the characteristics of the voltage Vopen which is the difference between the reference voltage and the output voltage of the sensor unit 110 generated corresponding to the adjustment current, and ends the process. For example, the adjusting unit 170 adjusts the reference voltage output by the reference voltage generating unit 120 such that the voltage Vopen becomes the voltage Vopen_adjust calculated at Step 1130. Alternatively, the adjusting unit 170 may adjust the reference voltage output by the reference voltage generating unit 120 such that the voltage Vopen_adjust becomes 0.

Figure 12:
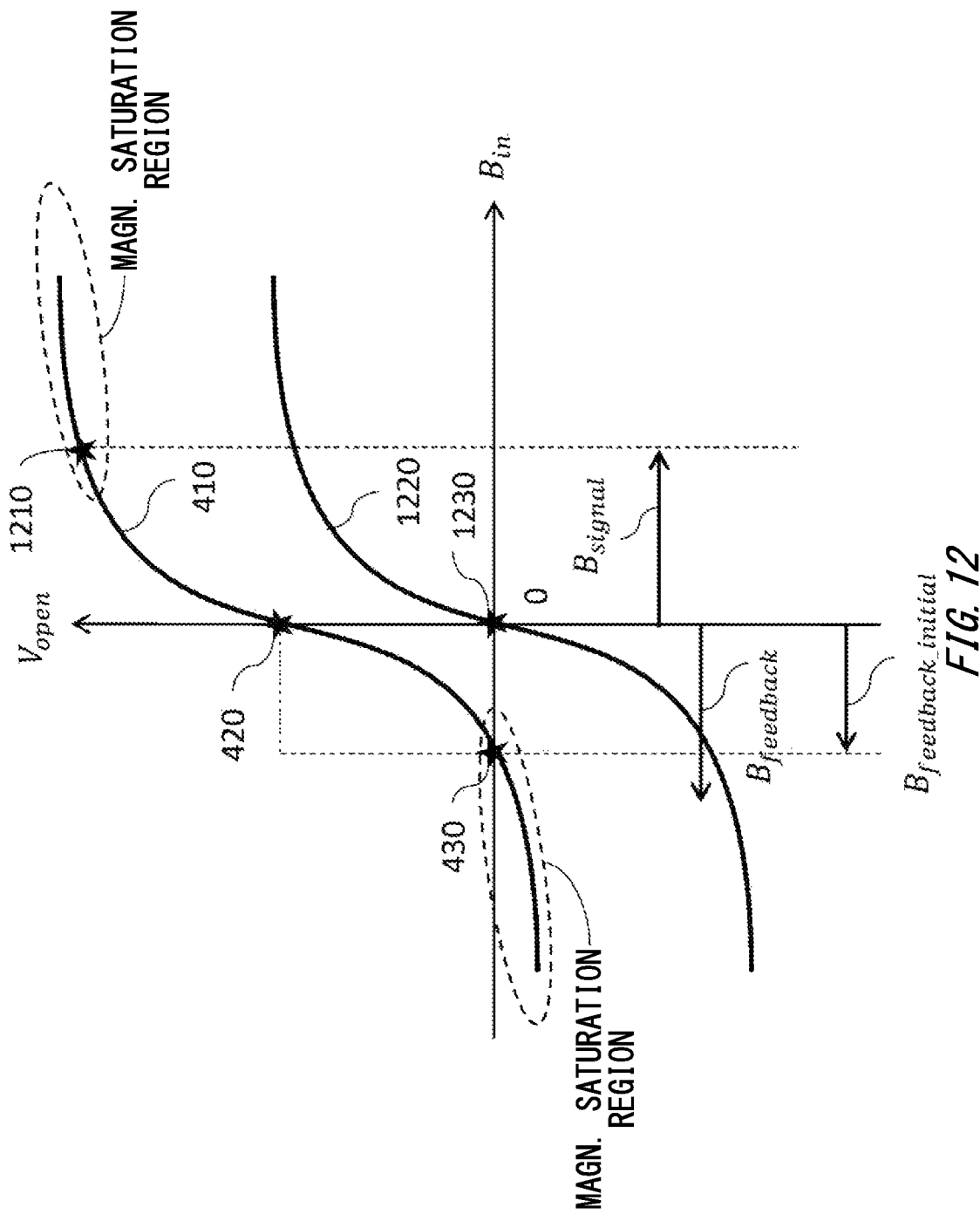
FIG. 12 illustrates characteristics of voltage Vopen generated corresponding to an input magnetic field Bin before and after magnetic operating point adjustment performed by the magnetic field measuring device 10 illustrated in FIG. 10 based on the flow illustrated in FIG. 11.

FIG. 12 illustrates characteristics of voltage Vopen generated corresponding to an input magnetic field Bin before and after magnetic operating point adjustment performed by the magnetic field measuring device 10 illustrated in FIG. 10 based on the flow illustrated in FIG. 11. Since explanations similar to those related to FIG. 9 apply to portions given the same symbols as those illustrated in FIG. 9, those explanations are omitted. A difference from FIG. 9 is that there is an applied input magnetic field Bin which has a finite value (defined as "Bsignal").

The switching unit 710 switches the state of control from the closed-loop control to the open loop while the magnetic field generating unit 140 is generating the feedback magnetic fields Bfeedback_initial and Bfeedback based on the feedback current. Then, since the feedback magnetic fields Bfeedback_initial and Bfeedback are no longer generated, the magnetic operating point of the first magnetoresistive element 112 and the second magnetoresistive element 114 transitions to a point 1210 based on the magnetic field Bsignal. In this state, the adjusting unit 170 performs magnetic operating point adjustment based on the flow illustrated in FIG. 11 to adjust the reference voltage output by the reference voltage generating unit 120. A curve 1220 illustrates characteristics of voltage Vopen generated corresponding to an input magnetic field Bin to the sensor unit 110 after magnetic operating point adjustment performed by the magnetic field measuring device 10 illustrated in FIG. 10 based on the flow illustrated in FIG. 11. The magnetic field measuring device 10 illustrated in FIG. 10 performs magnetic operating point adjustment based on the flow illustrated in FIG. 11 to thereby be able to cause a transition of the magnetic operating point of the first magnetoresistive element 112 and the second magnetoresistive element 114 from the point 1210 to a point 1230. This point 1230 is a point where the voltage Vopen=Vopen_adjust, and if the magnetic field measuring device 10 illustrated in FIG. 10 switches the state of control from the open loop to the closed loop in this state, and operates the first magnetoresistive element 112 and the second magnetoresistive element 114, the highest magnetic sensitivity can be attained.

Figure 13:
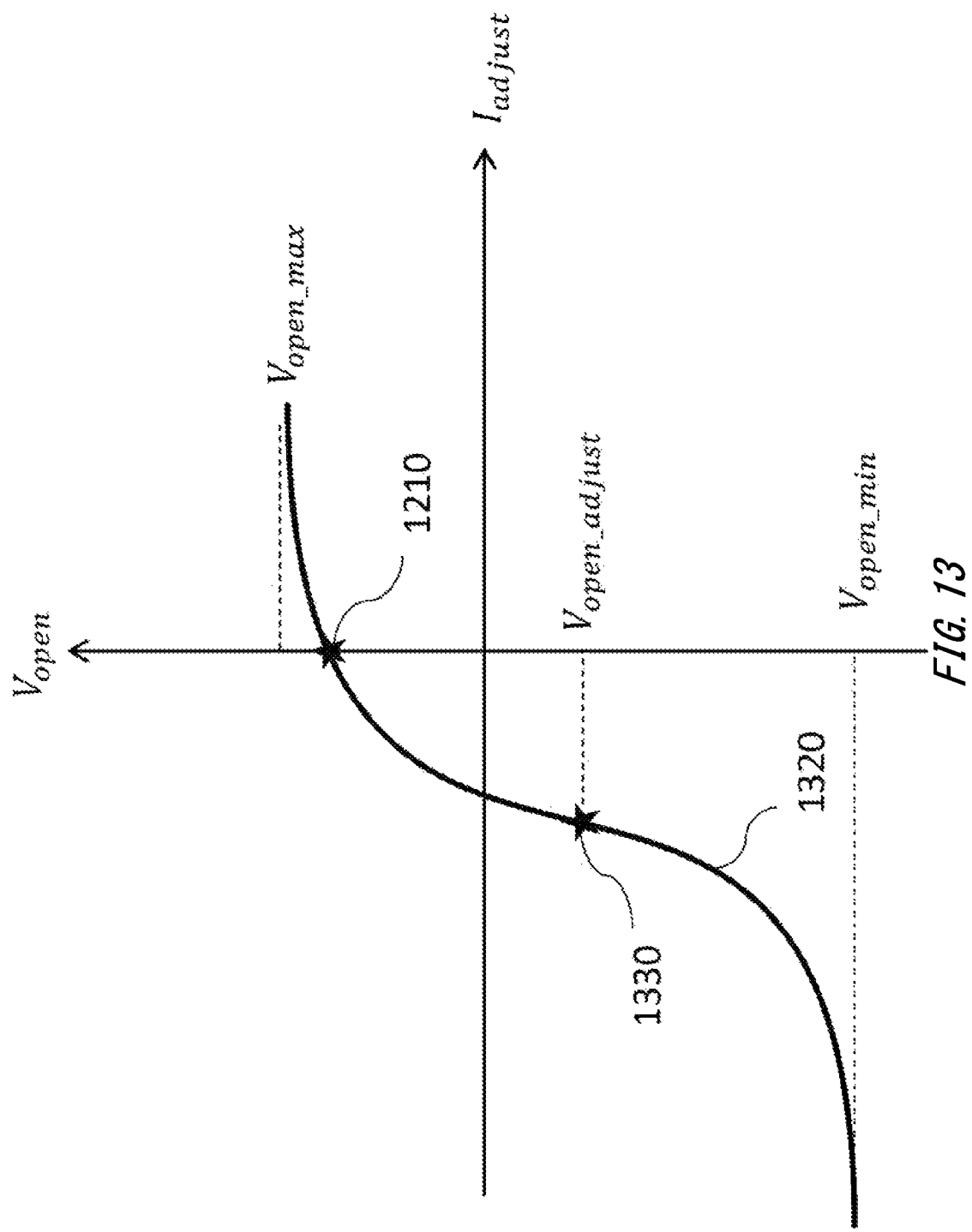
FIG. 13 illustrates characteristics of voltage Vopen generated corresponding to an adjustment current Iadjust used by an adjusting unit 170 in the magnetic field measuring device 10 illustrated in FIG. 10 for calculating voltage Vopen_adjust.

FIG. 13 illustrates characteristics of voltage Vopen generated corresponding to an adjustment current Iadjust used by the adjusting unit 170 in the magnetic field measuring device 10 illustrated in FIG. 10 for calculating voltage Vopen_adjust. The adjusting unit 170 acquires voltage Vopen characteristics generated corresponding to the adjustment current Iadjust like those illustrated by a curve 1320, for example, through Step 1120 illustrated in FIG. 11. Then, the adjusting unit 170 calculates the voltage Vopen_adjust based on the curve 1320. For example, the adjusting unit 170 acquires, from the curve 1320, a voltage Vopen_max which is the maximum of the voltage Vopen, and a voltage Vopen_min which is the minimum of the voltage Vopen, and calculates the average value of the voltage Vopen_max and Vopen_min as the voltage Vopen_adjust.

Figure 14:
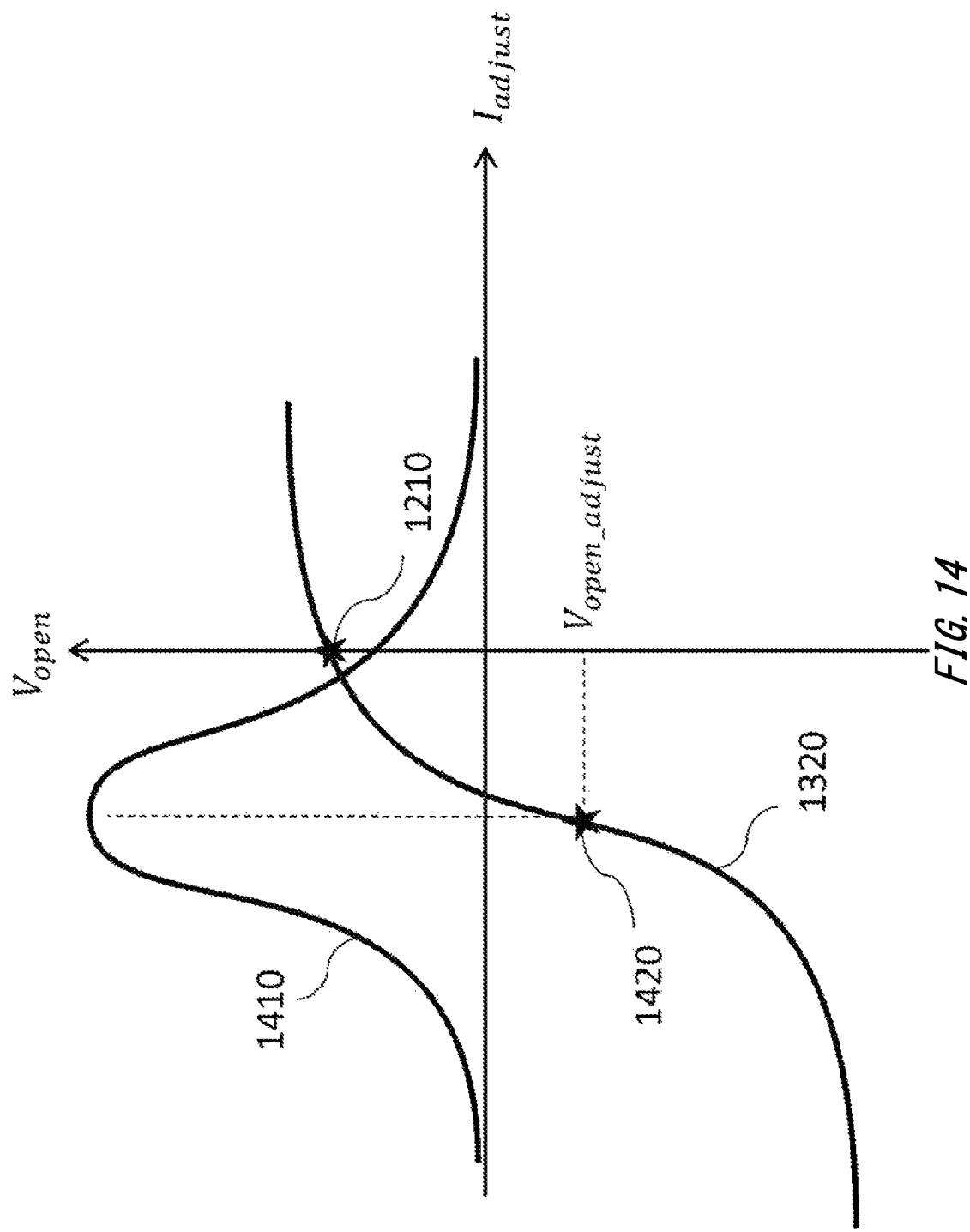
FIG. 14 illustrates dVopen/dIadjust characteristics used by the adjusting unit 170 in the magnetic field measuring device 10 illustrated in FIG. 10 for calculating voltage Vopen_adjust.

FIG. 14 illustrates characteristics of dVopen/dIadjust used by the adjusting unit 170 in the magnetic field measuring device 10 illustrated in FIG. 10 for calculating the voltage Vopen_adjust. The adjusting unit 170 differentiates the curve 1320 with respect to the adjustment current Iadjust to thereby obtain characteristics of dVopen/dIadjust in response to the adjustment current Iadjust like those illustrated in the curve 1410, for example. Then, the adjusting unit calculates the voltage Vopen at a point 1420 where dVopen/dIadjust becomes the maximum as the voltage Vopen_adjust.

Figure 15:
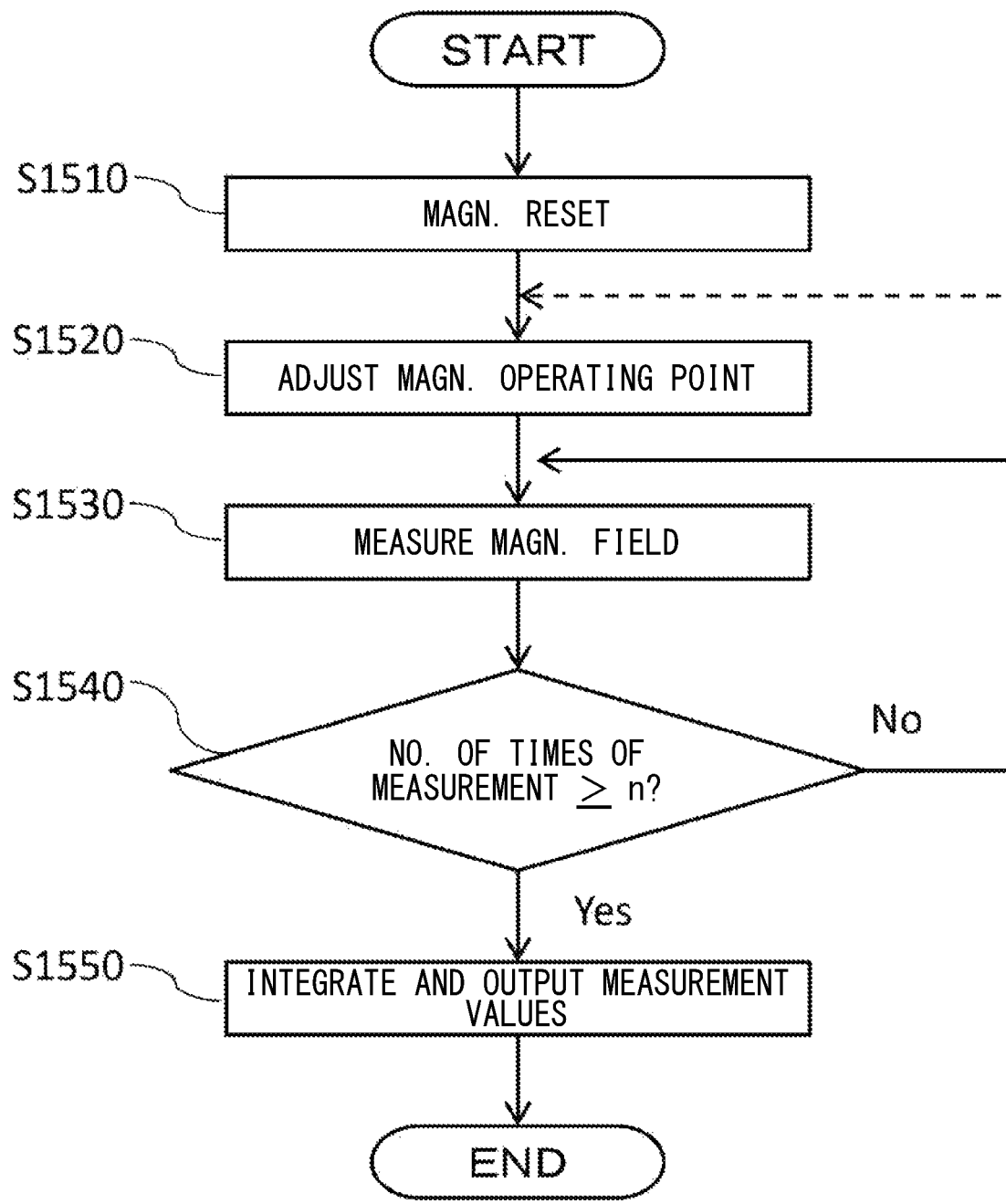
FIG. 15 illustrates a flow for the magnetic field measuring device 10 according to the present embodiment to measure a magnetic field.

FIG. 15 illustrates a flow for the magnetic field measuring device 10 according to the present embodiment to measure a magnetic field. At Step 1510, the magnetic field measuring device 10 magnetically resets the first magnetoresistive element 112 and the second magnetoresistive element 114. For example, before measurement of a measurement-target magnetic field by the magnetic field measuring unit 160, the adjusting unit 170 makes the reference voltage generating unit 120 generate a reference voltage that makes the feedback current generating unit 130 generate a reset magnetic field to magnetically saturate the first magnetoresistive element 112 and the second magnetoresistive element 114, and thereafter the adjusting unit 170 adjusts the reference voltage back to its original value, and stops generation of the reset magnetic field by the magnetic field generating unit 140. In this manner, this series of operation of applying a reset magnetic field to magnetically saturate the first magnetoresistive element 112 and the second magnetoresistive element 114 to the first magnetoresistive element 112 and the second magnetoresistive element 114, and thereafter removing the magnetic field is defined as magnetic resetting.

Typically, a magnetoresistive element may have various magnetization directions in a magnetic domain depending on the history of input magnetic forces, but the magnetization directions in the magnetic domain can be aligned once by performing magnetic resetting. Because of this, every time the magnetic field measuring device 10 measures a magnetic field, it can perform measurement under the same condition about the direction of the magnetization in a magnetic domain, and thereby measurement errors can be reduced. The magnetic resetting operation mentioned above can be executed, for example, at a time when the power source of the magnetic field measuring device 10 is turned on, at a time when an unintended magnetic field is detected by the magnetic field measuring device 10, at a time when a predetermined period has elapsed after a previous instance of magnetic resetting, at a time when the number of times of magnetic field measurement has reached a predetermined number of times after a previous instance of magnetic resetting, or at other times.

Next, at Step 1520, the adjusting unit 170 adjusts the magnetic operating point of the first magnetoresistive element 112 and the second magnetoresistive element 114 based on a flow illustrated in at least any one of FIGS. 3, 5, 8 and 11.

Next, at Step 1530, the magnetic field measuring unit 160 measures a measurement-target magnetic field. Then, at Step 1540, the magnetic field measuring device 10 judges whether or not the number of times of magnetic field measurement has reached a predetermined number of times n (n is an integer equal to or larger than 1). If a result of the judgement indicates that the number of times of magnetic field measurement is smaller than the predetermined number of times n, the magnetic field measuring device 10 returns to the process at Step 1530, and continues the processes. On the other hand, if a result of the judgement indicates that the number of times of magnetic field measurement has reached the predetermined number of times n, the magnetic field measuring device 10 proceeds to the process at Step 1550, and at Step 1550, the magnetic field measuring unit 160 integrates measurement values obtained in a predetermined period, e.g., integrates n measurement values or performs another process, outputs a result of the integration, and ends the process. According to the present embodiment, the magnetic field measuring unit 160 can obtain more precise output by integrating n measurement values, and outputting a result of the integration.

Note that although in the explanation above, the magnetic field measuring device 10 returns to the process at Step 1530 if the number of times of measurement is smaller than the predetermined number of times n at Step 1540, instead of this, it may return to the process at Step 1520 as illustrated by a dotted line in FIG. 15. That is, the magnetic field measuring device 10 may make the adjusting unit 170 adjust the magnetic operating point of the first magnetoresistive element 112 and the second magnetoresistive element 114 every time the magnetic field measuring unit 160 performs magnetic field measurement. By making the adjusting unit 170 adjust the magnetic operating point every time, it becomes possible to cause the first magnetoresistive element 112 and the second magnetoresistive element 114 to operate at a magnetic operating point where it can achieve a higher magnetic sensitivity.

Figure 16:
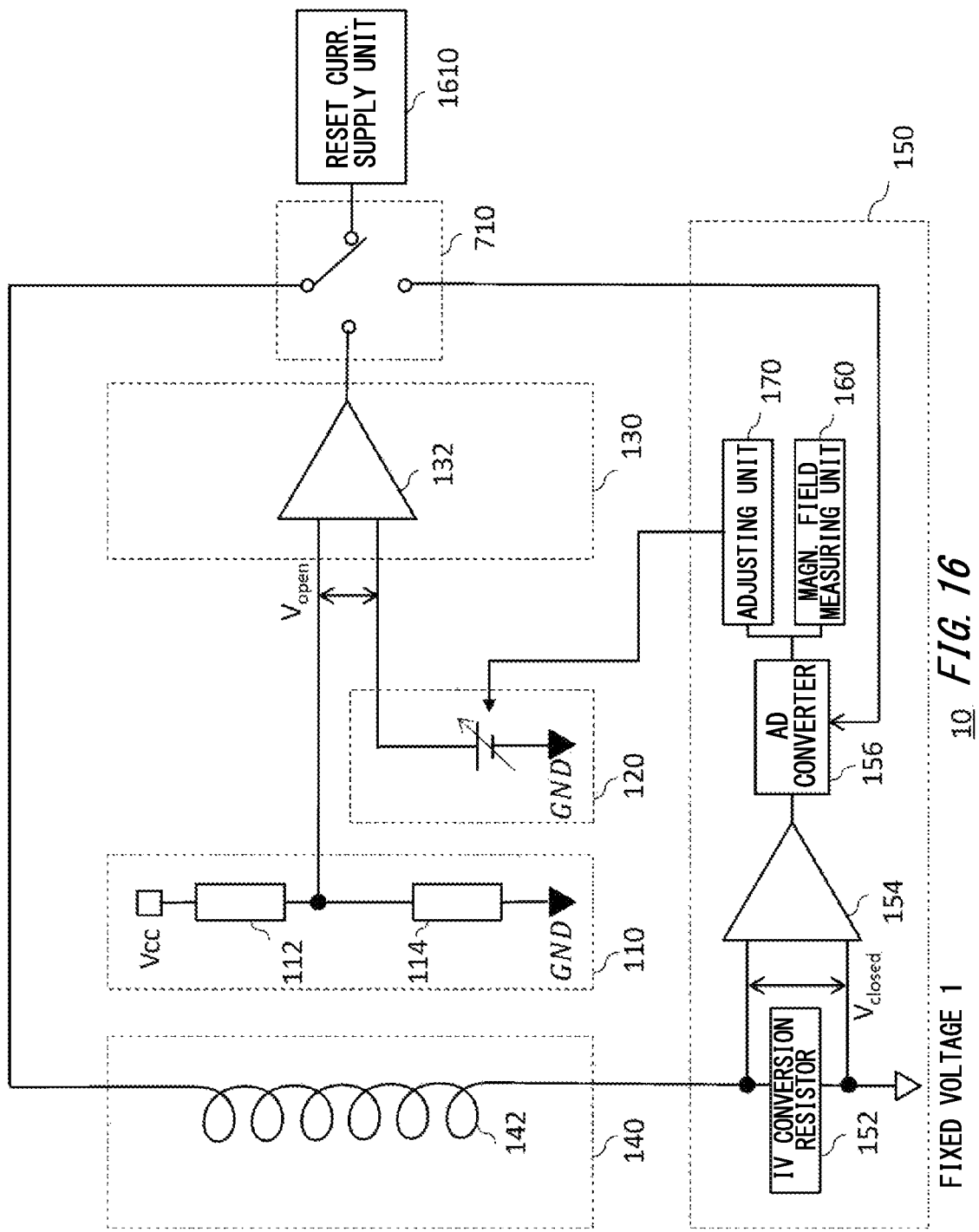
FIG. 16 illustrates the configuration of the magnetic field measuring device 10 provided with the switching unit 710 and a reset current generating unit 1610 according to a variant of the magnetic field measuring device 10 of the present embodiment.

FIG. 16 illustrates the configuration of the magnetic field measuring device 10 provided with the switching unit 710 and a reset current generating unit 1610 according to a variant of the magnetic field measuring device 10 of the present embodiment. The magnetic field measuring device 10 illustrated in this figure further includes the reset current generating unit 1610 in addition to the configurations of the magnetic field measuring device 10 illustrated in FIG. 7. Before measurement of a measurement-target magnetic field performed by the magnetic field measuring unit 160, the reset current generating unit 1610 supplies the magnetic field generating unit 140 with a reset current that generates a reset magnetic field to magnetically saturate the first magnetoresistive element 112 and the second magnetoresistive element 114. Although Step 1510 in the flow illustrated in FIG. 15 illustrated an example in which the adjusting unit 170 magnetically resets the first magnetoresistive element 112 and the second magnetoresistive element 114, as illustrated in this figure, the reset current generating unit 1610 may be further provided, and a reset magnetic field may be generated based on a reset current supplied by the reset current generating unit 1610 to magnetically reset the first magnetoresistive element 112 and the second magnetoresistive element 114. In addition, if the magnetic field measuring device 10 has the adjustment current generating unit 1010 as illustrated in FIG. 10, the function of the reset current generating unit 1610 may be realized by the adjustment current generating unit 1010. In addition, if the magnetic field measuring device 10 has the variable resistor 224 in the reference voltage generating unit 120, a reset magnetic field can also be generated by changing the resistance value of the variable resistor 224. For example, as in the embodiment illustrated in FIG. 2, since if the reference voltage generating unit 120 has the fixed resistor 222 and the variable resistor 224, and generates a reset magnetic field by adjusting the resistance value of the variable resistor 224, it is not required to use the reset current generating unit 1610, the system can be simplified. Here, in order to attain the reference voltage for generating a reset magnetic field, preferably, the output voltage range of the reference voltage generating unit 120 is larger than the output voltage range of the sensor unit 110. Note that the output voltage range is defined as the difference between the maximum value that the output voltage can assume and the minimum value that the output voltage can assume.

Figure 17:
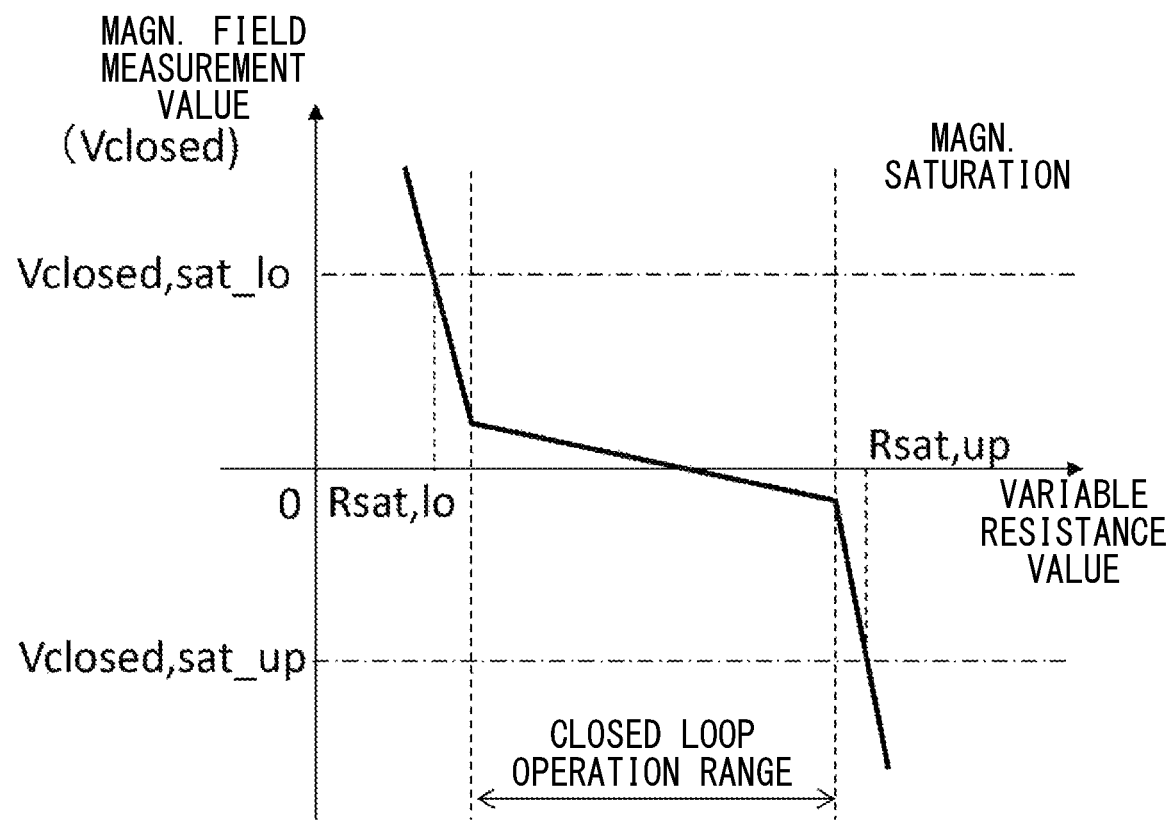
FIG. 17 illustrates how voltage Vclosed changes when the resistance value of the variable resistor 224 is changed in the magnetic field measuring device 10 according to the present embodiment.

FIG. 17 is a figure illustrating how voltage Vclosed changes when the resistance value of the variable resistor 224 is changed in the embodiment illustrated in FIG. 2. The voltage Vclosed shows small changes if the variable resistance value is between Rsat,lo and Rsat,up. But if the variable resistance value is equal to or smaller than Rsat,lo or is equal to or larger than Rsat,up, the voltage Vclosed becomes very large or small, and for example the output value of the magnetic field measuring unit 160 (AD value of the voltage Vclosed) overflows (stays at the upper limit or lower limit of the output), or almost overflows. That is, the closed loop of the magnetic field measuring device 10 operates normally if the variable resistance value is between Rsat,lo and Rsat,up. But since the magnetoresistive elements are magnetically saturated, and an input magnetic field to the sensor unit 110 cannot be cancelled out normally by a feedback magnetic field if the variable resistance value is equal to or smaller than Rsat,lo or is equal to or larger than Rsat,up, the magnetic field measuring device 10 does not operate in the closed loop. Accordingly, magnetic resetting of the magnetoresistive elements can be performed by making the variable resistance value equal to or smaller than Rsat,lo or equal to or larger than Rsat,up. Here, Rsat,up is defined as the upper reset magnetic field generating resistance value, and the output voltage of the reference voltage generating unit 120 generated at this time is defined as the upper reset magnetic field generating voltage. In addition, Rsat,lo is defined as the lower reset magnetic field generating resistance value, and the output voltage of the reference voltage generating unit 120 generated at this time is defined as the lower reset magnetic field generating voltage.

The output range (the closed loop operation output range) of the voltage Vclosed in which it operates in the closed loop may be set as Vclosed,sat_up to Vclosed,sat_lo, and the magnetic field measuring device 10 may measure the voltage Vclosed while changing the resistance of the variable resistor 224 in the reference voltage generating unit 120, and may detect resistance values that generated output exceeding this output range as Rsat,up and Rsat,lo, respectively. Then, the adjusting unit 170 may adjust the magnetic operating point of the magnetoresistive elements based on the upper reset magnetic field generating resistance value Rsat,up or the lower reset magnetic field generating resistance value Rsat,lo. For example, the adjusting unit 170 may adjust the variable resistor 224 such that the magnetoresistive elements operate at a magnetic operating point at which it can theoretically attain a high magnetic resolution. Then, the resistance of such a magnetoresistive element (one element) is the resistance value which is shifted by about ½ to ¼ of the range of resistance changes that are observed as a response to a magnetic field from the high resistance side of the range. In view of this, the resistance value of the variable resistor 224 may be set to a resistance value of ½ to ¼ (e.g., ¼ or larger and ½ or smaller) of the range of the upper reset magnetic field generating resistance value Rsat,up and the lower reset magnetic field generating resistance value Rsat,lo that generate reset magnetic field generating voltages. For example, since resistance change curves that are symmetric with respect to a magnetic field overlap, if there are two magnetoresistive elements, the resistance value of the variable resistor 224 may be set to the mean value (½) of the upper reset magnetic field generating resistance value Rsat,up and the lower reset magnetic field generating resistance value Rsat,lo. In addition, for example, if there is one magnetoresistive element, the resistance value of the variable resistor 224 may be set to a resistance value of ½ to ¼ (e.g., ¼ or larger and ½ or smaller) of the range of the upper reset magnetic field generating resistance value Rsat,up and the lower reset magnetic field generating resistance value Rsat,lo. Note that this resistance value is obtained if the variable resistor 224 is at an arrangement position where one of the terminals of the variable resistor 224 is on the side of the fixed resistor 222 and the other terminal is on the GND side as illustrated in FIG. 2, and if the latter terminal is arranged on the VCC side, the resistance value may be a resistance value of ½ to ¾ of the range of the upper reset magnetic field generating resistance value Rsat,up and the lower reset magnetic field generating resistance value Rsat,lo. Since, in this manner, the magnetic field measuring device 10 can adjust the magnetic operating point of the magnetoresistive elements by changing the variable resistor 224, it can make the magnetoresistive elements operate at a point where a high magnetic resolution can be attained. Stated differently, before measurement of a measurement-target magnetic field performed by the magnetic field measuring unit 160, the adjusting unit 170: changes the resistance value of the variable resistor 224 provided in the reference voltage generating unit 120; makes the reference voltage generating unit 120 generate reset magnetic field generating voltages (upper reset magnetic field generating voltage and lower reset magnetic field generating voltage) that generate the reset magnetic field; and adjusts the reference voltage based on the resistance values of the variable resistor 224 that generate the reset magnetic field generating voltages. That is, the magnetic field measuring device 10 changes the resistance value of the variable resistor 224 while measuring the voltage Vclosed so as to detect the upper reset magnetic field generating resistance value Rsat, up and the lower reset magnetic field generating resistance value Rsat,lo, and adjusts the voltage generated by the reference voltage generating unit 120 based on the detected upper reset magnetic field generating resistance value Rsat, up and the lower reset magnetic field generating resistance value Rsat,lo. At this time, the magnetic field measuring device 10 may first change the resistance value of the variable resistor 224 so as to detect the upper reset magnetic field generating resistance value Rsat,up, or may first change the resistance value of the variable resistor 224 so as to detect the lower reset magnetic field generating resistance value Rsat,lo. In addition, if the MR ratio (MR ratio=Rsat, up/Rsat,lo) of a magnetoresistive element is known in advance, the magnetic field measuring device 10 may adjust the voltage generated by the reference voltage generating unit 120 based on the known MR ratio after detecting any one of the upper reset magnetic field generating resistance value Rsat,up and the lower reset magnetic field generating resistance value Rsat,lo. Note that, by changing the arrangement position of the variable resistor 224 as explained above, the resistance value of the variable resistor 224 is set to a resistance value of either ½ to ¾ or ½ to ¼ of the range of the upper reset magnetic field generating resistance value Rsat,up and the lower reset magnetic field generating resistance value Rsat,lo. Such cases are also aspects of the present embodiment.

Figure 18:
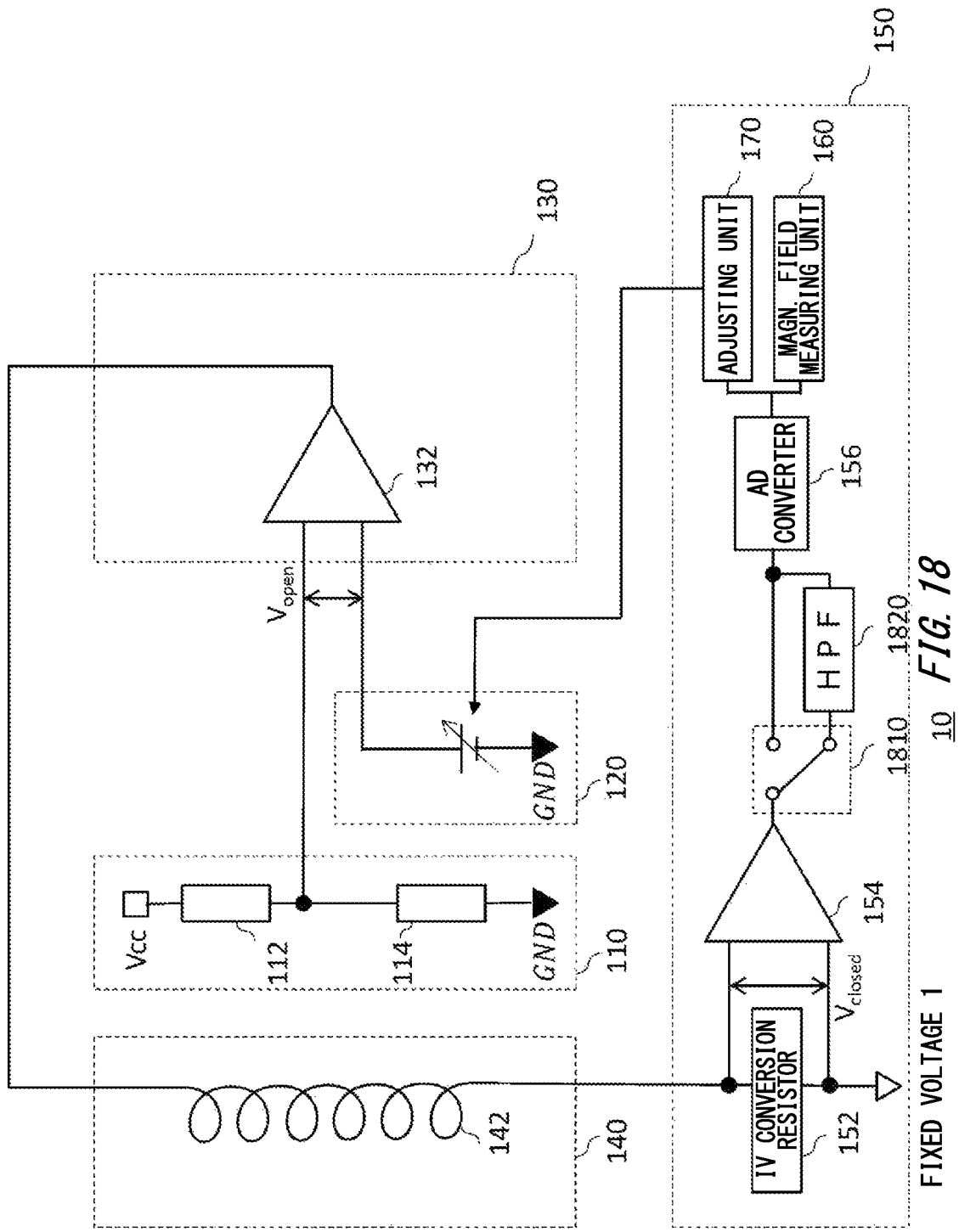
FIG. 18 illustrates the configuration of the magnetic field measuring device 10 provided with a switch 1710 and a high-pass filter 1720 according to a variant of the magnetic field measuring device 10 of the present embodiment.

FIG. 18 illustrates the configuration of the magnetic field measuring device 10 provided with a switch 1810 and a high-pass filter 1820 according to a variant of the magnetic field measuring device 10 of the present embodiment. The magnetic field measuring device 10 illustrated in this figure includes the switch 1810 and high-pass filter 1820 in addition to the configurations of the magnetic field measuring device 10 illustrated in FIG. 1. The switch 1810 is provided between the second operational amplifier 154 and the AD converter 156, and switches whether to supply an output voltage VAMP of the second operational amplifier 154 directly to the AD converter 156 or to supply output of the second operational amplifier to the AD converter 156 via the high-pass filter 1820. The high-pass filter 1820 allows passage therethrough of high-frequency components of the output voltage VAMP of the second operational amplifier 154, and supplies them to the AD converter 156.

The magnetic field measuring device 10 illustrated in this figure switches the switch 1810 to supply the output voltage VAMP of the second operational amplifier 154 directly to the AD converter 156 bypassing the high-pass filter 1820 in an adjustment phase, and supplies the output voltage VAMP of the second operational amplifier 154 to the AD converter 156 via the high-pass filter 1820 in a measurement phase. Thereby, if a measurement-target magnetic field is AC components in a measurement phase, unnecessary DC components can be blocked, and the magnetic field measuring unit 160 can measure the measurement-target magnetic field more precisely.

Figure 19:
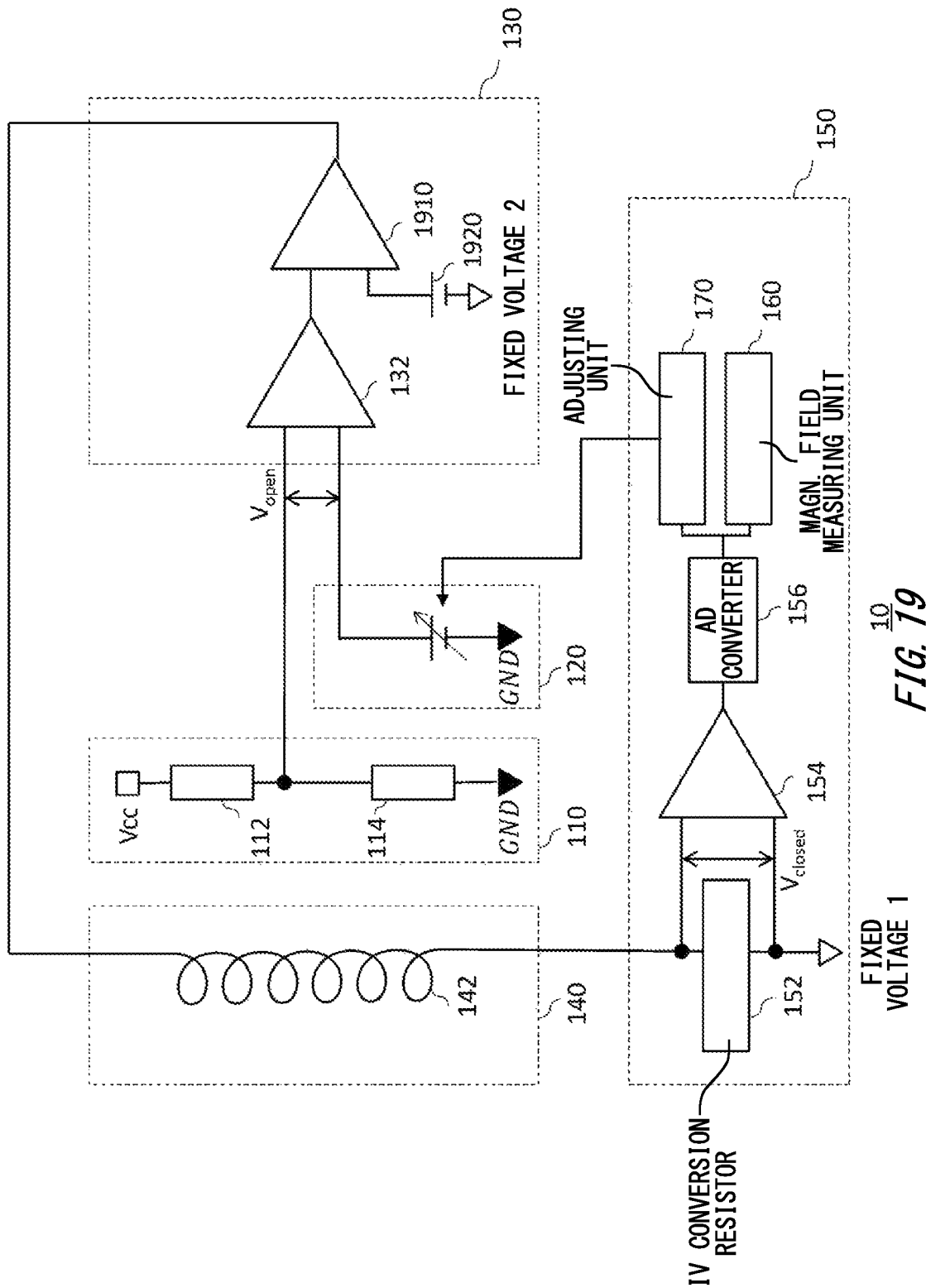
FIG. 19 illustrates the configuration of the magnetic field measuring device 10 provided with a third operational amplifier 1910 according to a variant of the magnetic field measuring device 10 of the present embodiment.

FIG. 19 illustrates the configuration of the magnetic field measuring device 10 provided with a third operational amplifier 1910 according to a variant of the magnetic field measuring device 10 of the present embodiment. The magnetic field measuring device 10 illustrated in this figure further includes the third operational amplifier 1910 in addition to the configurations of the magnetic field measuring device 10 illustrated in FIG. 1, and the feedback current generating unit 130 is formed by using two or more operational amplifiers. The third operational amplifier 1910 has one differential input terminal connected to output of the first operational amplifier 132, and another differential input terminal connected to the fixed voltage source 1920. The feedback current generating unit 130 illustrated in this figure may make the first operational amplifier 132 output the voltage Vopen which is the difference between the reference voltage and the output voltage of the sensor unit 110, and make the third operational amplifier 1910 generate a feedback current based on the difference between the voltage Vopen and the fixed voltage 2. Here, the same voltage may be set for the fixed voltage 1 and the fixed voltage 2.

Figure 20:
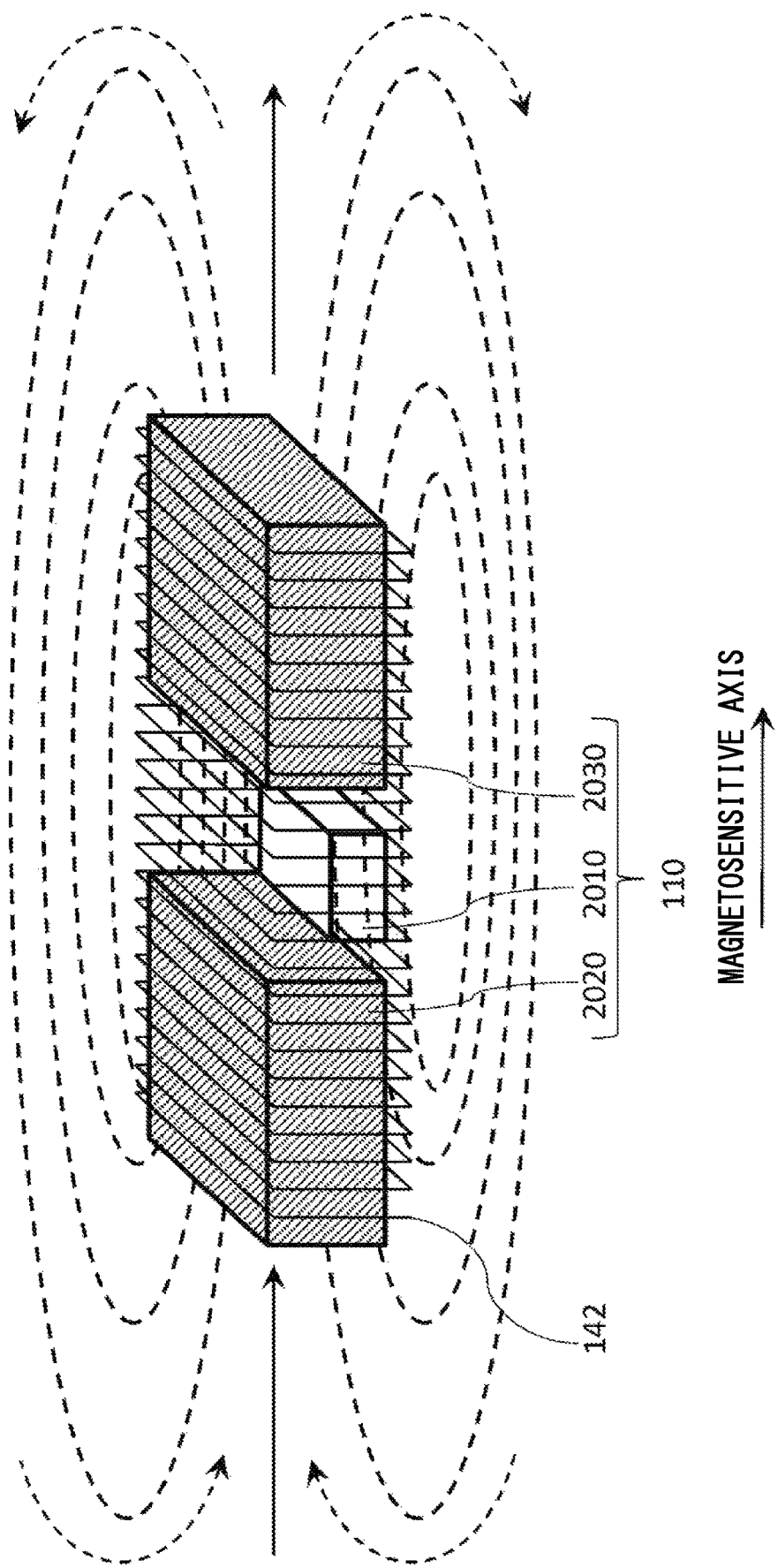
FIG. 20 illustrates a specific example of a sensor unit 110 according to the present embodiment.

FIG. 20 illustrates a specific example of a sensor unit 110 according to the present embodiment. The sensor unit 110 has a magnetoresistive element 2010, and magnetic flux concentrators 2020 and 2030 (the magnetic flux concentrator 2020 and the magnetic flux concentrator 2030 are collectively referred to as a "magnetic flux concentrating unit") that are arranged at both ends of the magnetoresistive element 2010. Note that, here, the magnetoresistive element 2010 may be at least one of the first magnetoresistive element 112 and the second magnetoresistive element 114, for example. The magnetic flux concentrators 2020 and 2030 are arranged at both ends of the magnetoresistive element 2010 so as to sandwich the magnetoresistive element 2010. That is, the sensor unit 110 includes the magnetic flux concentrating unit arranged adjacent to the magnetoresistive element 2010. In this figure, the magnetic flux concentrator 2020 is provided on the negative side of the magnetoresistive element 2010 along the magnetosensitive axis, and the magnetic flux concentrator 2030 is provided on the positive side of the magnetoresistive element 2010 along the magnetosensitive axis. Note that, here, the magnetosensitive axis may lie along the direction of magnetization that is fixed by a magnetization fixed layer forming the magnetoresistive element 2010. In addition, if a magnetic field is input from the negative side of the magnetosensitive axis toward its positive side, the resistance of the magnetoresistive element 2010 may increase or decrease. The magnetic flux concentrators 2020 and 2030 are formed of a material having high magnetic permeability such as Permalloy, for example. Then, if the sensor unit 110 is configured in the manner as illustrated in the present specific example, the coil 142 is wound to surround cross-sections of the magnetoresistive element 2010, and the magnetic flux concentrators 2020 and 2030 arranged at both ends of the magnetoresistive element 2010. That is, the feedback current generating unit 130 is formed to surround the magnetoresistive element 2010 and the magnetic flux concentrating unit. In addition, if the sensor unit 110 has a plurality of magnetoresistive elements 2010, it may have a plurality of sets of a magnetoresistive element and magnetic flux concentrators arranged at both ends thereof In this case, one coil 142 may be wound to surround a set of a magnetoresistive element and magnetic flux concentrators arranged at both ends thereof.

If such a sensor unit 110 receives a magnetic field from the negative side of the magnetosensitive axis to its positive side, the magnetic flux concentrators 2020 and 2030 formed of a material having high magnetic permeability are magnetized to thereby generate a magnetic flux distribution like the one indicated by broken lines in this figure. Then, magnetic fluxes generated by magnetization of the magnetic flux concentrators 2020 and 2030 pass through the position of the magnetoresistive element 2010 sandwiched between the two magnetic flux concentrators 2020 and 2030. Because of this, the magnetic flux density at the position of the magnetoresistive element 2010 can be significantly increased by arranging the magnetic flux concentrators 2020 and 2030. In addition, as in the present specific example, by using the magnetoresistive element 2010 arranged at a position with a small area sandwiched by the magnetic flux concentrators 2020 and 2030 to perform sampling of the spatial distribution of a magnetic field, it becomes possible to make a sampling point in the space clear.

Figure 21:
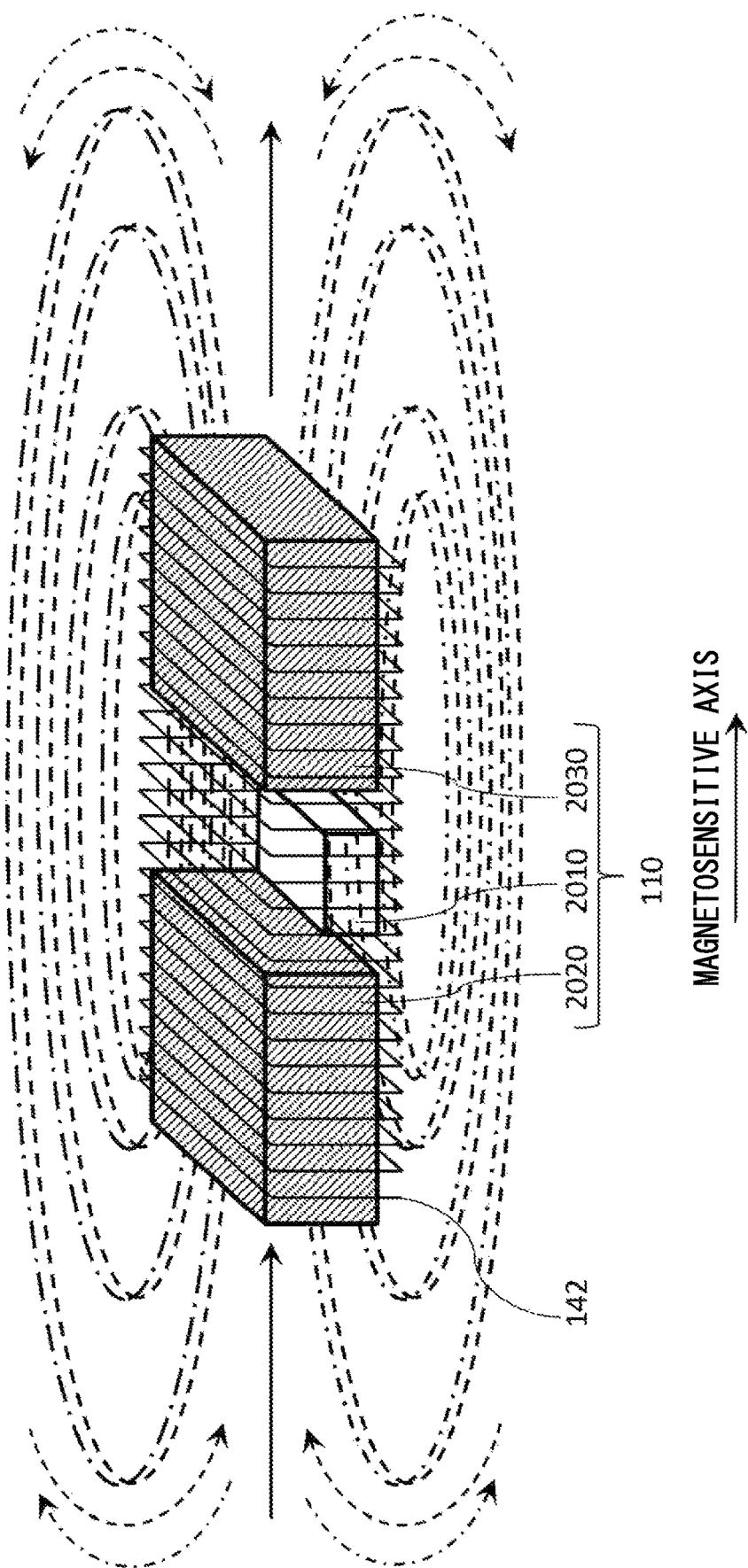
FIG. 21 illustrates a magnetic flux distribution observed when a feedback magnetic field is generated to the sensor unit 110 according to the present specific example.

FIG. 21 illustrates a magnetic flux distribution observed when a feedback magnetic field is generated to the sensor unit 110 according to the present specific example. In FIG. 21, members having the same functions and configurations as those of members illustrated in FIG. 20 are given the same symbols, and also explanations related to matters other than differences therebetween are omitted hereinafter. If a feedback current is supplied to the coil 142 in the sensor unit 110 according to the present specific example, the coil 142 generates a feedback magnetic field to thereby generate a magnetic flux distribution like the one illustrated by alternate long and short dash lines in this figure. Magnetic fluxes generated by this feedback magnetic field are spatially distributed to cancel out the spatial distribution of a magnetic field input to the magnetoresistive element 2010 and magnetically amplified by the magnetic flux concentrators 2020 and 2030. Because of this, as illustrated in the present specific example, if the magnetic flux concentrators 2020 and 2030 are arranged at both ends of the magnetoresistive element 2010, the sensor unit 110 can accurately cancel out the magnetic field distribution at the position of the magnetoresistive element 2010 by using the feedback magnetic field; as a result, it becomes possible to realize a sensor with high linearity between an input magnetic field and an output voltage.

Figure 22:
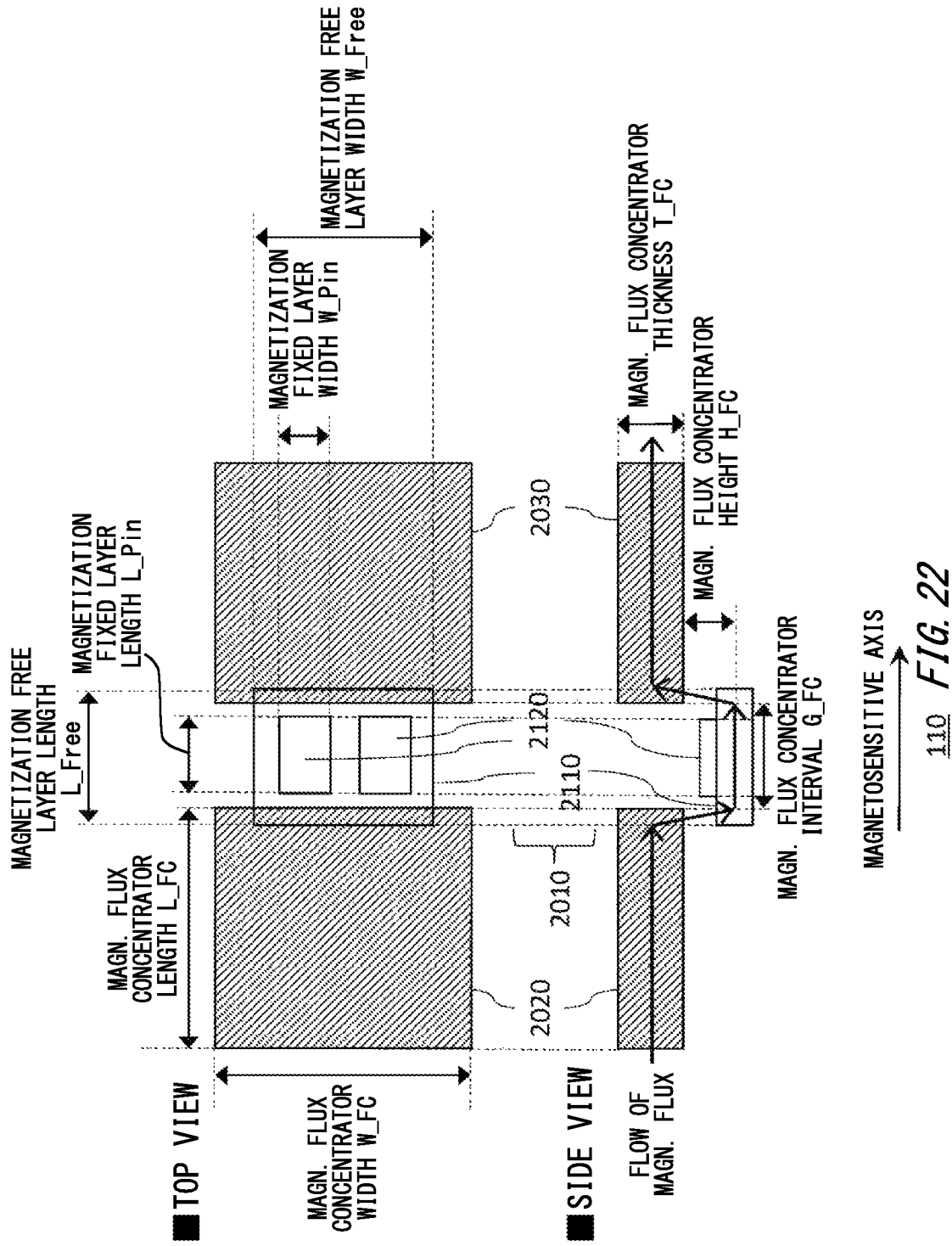
FIG. 22 illustrates an exemplary configuration of the sensor unit 110 according to the present specific example.

FIG. 22 illustrates an exemplary configuration of the sensor unit 110 according to the present specific example. In FIG. 22, members having the same functions and configurations as those of members illustrated in FIG. 20 are given the same symbols, and also explanations related to matters other than differences therebetween are omitted hereinafter. In this figure, the magnetoresistive element 2010 has a magnetization free layer 2110 and a magnetization fixed layer 2120. Typically, the magnetoresistive element 2010 has a structure in which two ferromagnetic layers sandwich an insulator thin-film layer. The magnetization free layer 2110 is a layer which is one of the two ferromagnetic layers, and has a magnetization direction that changes depending on an external magnetic field. In addition, the magnetization fixed layer 2120 is a layer which is the other of the two ferromagnetic layers, and has a magnetization direction which does not change even if it receives an external magnetic field. For example, the magnetoresistive element 2010 has the magnetization free layer 2110, a non-magnetic layer, and the magnetization fixed layer 2120 that are stacked on a substrate in this order.

In the present specific example, the magnetoresistive element 2010 is a magnetoresistive element having a so-called bottom free structure in which the magnetization free layer 2110 is arranged at a lower portion, and the magnetization fixed layer 2120 is arranged at an upper portion of the magnetization free layer 2110 via an insulator thin-film layer (not illustrated). Since a magnetoresistive element with the bottom free structure allows the magnetization free layer 2110 to be formed to have a relatively wide area, a high magnetic sensitivity can be attained. Note that, in the magnetoresistive element 2010, when seen from above, the area of the magnetization fixed layer 2120 is smaller than the area of the magnetization free layer 2110, and the magnetosensitive area is determined based on the area of the magnetization fixed layer 2120.

In addition, in the present specific example, the sensor unit 110 has the magnetic flux concentrators 2020 and 2030 that are arranged at both ends of the magnetoresistive element 2010 so as to sandwich the magnetoresistive element 2010 at the middle of their interval, via an insulation layer (not illustrated) at an upper portion of the magnetoresistive element 2010. Thereby, the magnetoresistive element 2010 is arranged in a small space sandwiched by the magnetic flux concentrators 2020 and 2030.

Here, in this figure, the length of the magnetization free layer 2110 along the magnetosensitive axis direction is defined as a magnetization free layer length L_Free. In addition, the length of the magnetization free layer 2110 along an axis perpendicular to the magnetosensitive axis direction when seen from above is defined as a magnetization free layer width W_Free. In addition, the length of the magnetization fixed layer 2120 along the magnetosensitive axis direction is defined as a magnetization fixed layer length L_Pin. In addition, the length of the magnetization fixed layer 2120 along an axis perpendicular to the magnetosensitive axis direction when seen from above is defined as a magnetization fixed layer width W_Pin. In addition, the length from one outer end of a magnetic flux concentrator to one outer end of the magnetization free layer along the magnetosensitive axis direction (in this figure, the length from the left end of the magnetic flux concentrator 2020 to its right end along the magnetosensitive axis direction, and the length from the right end of the magnetic flux concentrator 2030 to its left end along the magnetosensitive axis direction) is defined as a magnetic flux concentrator length L_FC. In addition, the length of the magnetic flux concentrator along an axis perpendicular to the magnetosensitive axis direction when seen from above is defined as a magnetic flux concentrator width W_FC. In addition, the length of the magnetic flux concentrator along an axis perpendicular to the magnetosensitive axis direction when seen from side is defined as a magnetic flux concentrator thickness T_FC. In addition, the interval between the two magnetic flux concentrators 2020 and 2030 along the magnetosensitive axis direction (in this figure, the length from the right end of the magnetic flux concentrator 2020 to the left end of the magnetic flux concentrator 2030 along the magnetosensitive axis direction) is defined as a magnetic flux concentrator interval G_FC. In addition, an interval from the center of the magnetization free layer 2110 in its thickness direction to the bottom surface of the magnetic flux concentrator along an axis perpendicular to the magnetosensitive axis direction when seen from side is defined as a magnetic flux concentrator height H_FC.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable media may include any tangible device that can store instructions for execution by a suitable device, such that the computer-readable medium having instructions stored therein comprises an article of manufacture including instructions which can be executed to create means for performing operations specified in the flowcharts or block diagrams. Examples of computer-readable media may include an electronic storage medium, a magnetic storage medium, an optical storage medium, an electromagnetic storage medium, a semiconductor storage medium, etc. More specific examples of computer-readable media may include a floppy disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY® disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

Figure 23:
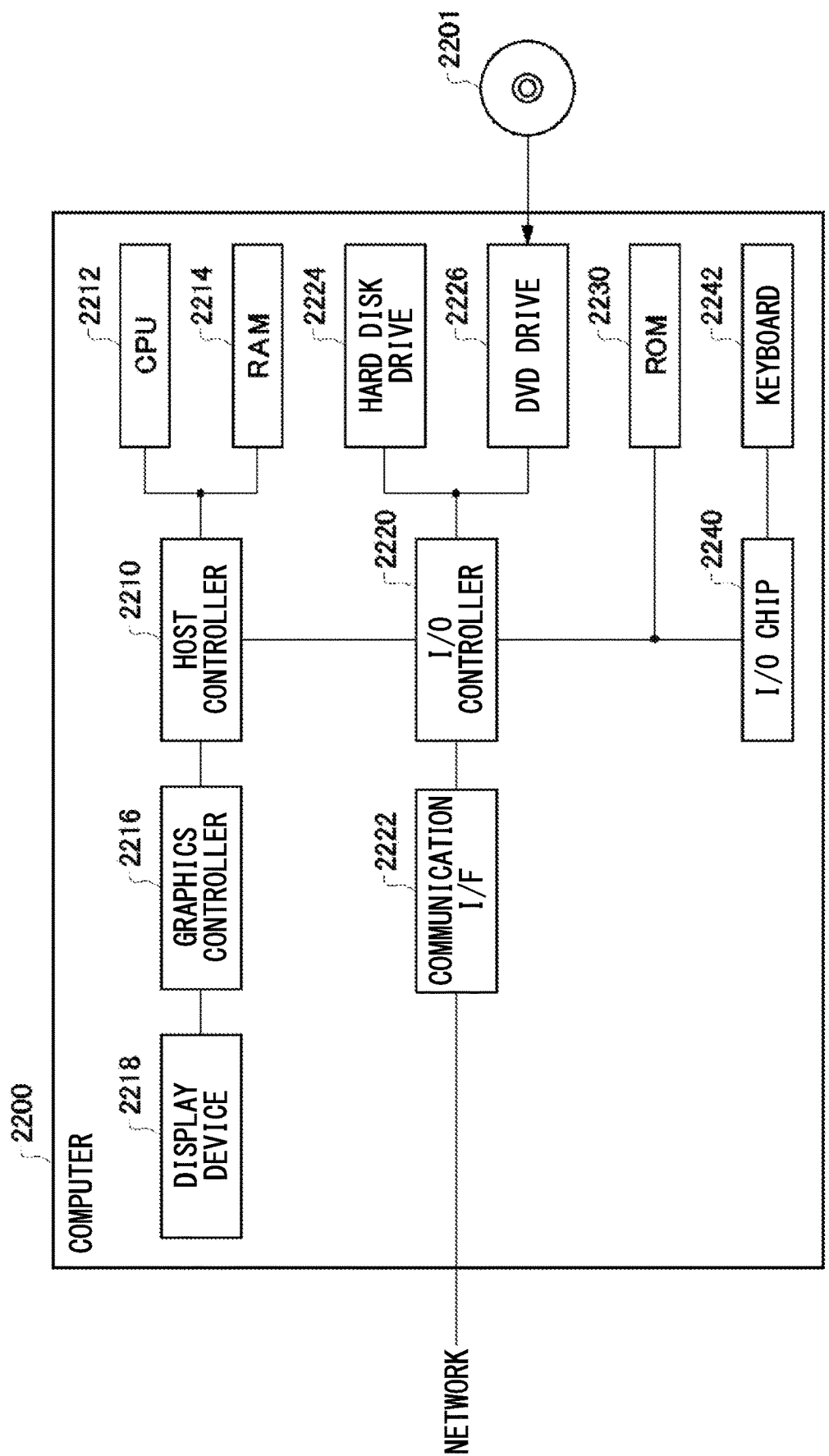
FIG. 23 shows an example of a computer 2200 in which aspects of the present invention may be wholly or partly embodied.

FIG. 23 shows an example of a computer 2200 in which aspects of the present invention may be wholly or partly embodied. A program that is installed in the computer 2200 can cause the computer 2200 to function as or perform operations associated with apparatuses of the embodiments of the present invention or one or more sections thereof, and/or cause the computer 2200 to perform processes of the embodiments of the present invention or steps thereof. Such a program may be executed by the CPU 2212 to cause the computer 2200 to perform certain operations associated with some or all of the blocks of flowcharts and block diagrams described herein.

The computer 2200 according to the present embodiment includes a CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226 and an IC card drive, which are connected to the host controller 2210 via an input/output controller 2220. The computer also includes legacy input/output units such as a ROM 2230 and a keyboard 2242, which are connected to the input/output controller 2220 through an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 within the computer 2200. The DVD-ROM drive 2226 reads the programs or the data from the DVD-ROM 2201, and provides the hard disk drive 2224 with the programs or the data via the RAM 2214. The IC card drive reads programs and data from an IC card, and/or writes programs and data into the IC card.

The ROM 2230 stores therein a boot program or the like executed by the computer 2200 at the time of activation, and/or a program depending on the hardware of the computer 2200. The input/output chip 2240 may also connect various input/output units via a parallel port, a serial port, a keyboard port, a mouse port, and the like to the input/output controller 2220.

A program is provided by computer readable media such as the DVD-ROM 2201 or the IC card. The program is read from the computer readable media, installed into the hard disk drive 2224, RAM 2214, or ROM 2230, which are also examples of computer readable media, and executed by the CPU 2212. The information processing described in these programs is read into the computer 2200, resulting in cooperation between a program and the above-mentioned various types of hardware resources. An apparatus or method may be constituted by realizing the operation or processing of information in accordance with the usage of the computer 2200.

For example, when communication is performed between the computer 2200 and an external device, the CPU 2212 may execute a communication program loaded onto the RAM 2214 to instruct communication processing to the communication interface 2222, based on the processing described in the communication program. The communication interface 2222, under control of the CPU 2212, reads transmission data stored on a transmission buffering region provided in a recording medium such as the RAM 2214, the hard disk drive 2224, the DVD-ROM 2201, or the IC card, and transmits the read transmission data to a network or writes reception data received from a network to a reception buffering region or the like provided on the recording medium.

In addition, the CPU 2212 may cause all or a necessary portion of a file or a database to be read into the RAM 2214, the file or the database having been stored in an external recording medium such as the hard disk drive 2224, the DVD-ROM drive 2226 (DVD-ROM 2201), the IC card, etc., The CPU 2212 may then write back the processed data to the external recording medium.

Various types of information, such as various types of programs, data, tables, and databases, may be stored in the recording medium to undergo information processing. The CPU 2212 may perform various types of processing on the data read from the RAM 2214, which includes various types of operations, processing of information, condition judging, conditional branch, unconditional branch, search/replace of information, etc., as described throughout this disclosure and designated by an instruction sequence of programs, and writes the result back to the RAM 2214. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 2200. In addition, a recording medium such as a hard disk or a RAM provided in a server system connected to a dedicated communication network or the Internet can be used as the computer readable media, thereby providing the program to the computer 2200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A magnetic field measuring device comprising:
    a sensor unit that has at least one magnetoresistive element;
    a reference voltage generating unit that outputs a reference voltage;
    a magnetic field generating unit that generates a magnetic field to be applied to the sensor unit;
    a feedback current generating unit that supplies, according to a difference between an output voltage of the sensor unit and the reference voltage, the magnetic field generating unit with a feedback current that generates a feedback magnetic field to diminish an input magnetic field to the sensor unit;
    a magnetic field measuring unit that outputs a measurement value corresponding to the feedback current; and
    an adjusting unit that uses the output voltage of the sensor unit to adjust the reference voltage.

2. The magnetic field measuring device according to claim 1, wherein
    in an adjustment phase, the adjusting unit adjusts the reference voltage; and
    in a measurement phase, the magnetic field measuring unit outputs a measurement value corresponding to the feedback current generated for a measurement-target magnetic field.

3. The magnetic field measuring device according to claim 1, wherein
    the reference voltage generating unit has at least one variable resistor, and
    the adjusting unit changes a resistance value of the variable resistor to adjust the reference voltage.

4. The magnetic field measuring device according to claim 1, wherein the adjusting unit adjusts the reference voltage based on the feedback current.

5. The magnetic field measuring device according to claim 4, wherein, upon the sensor unit receiving an adjustment magnetic field, the adjusting unit adjusts the reference voltage such that the measurement value falls within a predetermined range as a result of the reception of the adjustment magnetic field.

6. The magnetic field measuring device according to claim 4, wherein the adjusting unit adjusts the reference voltage so as to lower a variance of the feedback current.

7. The magnetic field measuring device according to claim 1, further comprising a switching unit that switches whether to or not to supply the feedback current to the magnetic field generating unit, wherein
    the adjusting unit uses the output voltage of the sensor unit generated while the feedback current is not being supplied to the magnetic field generating unit to adjust the reference voltage.

8. The magnetic field measuring device according to claim 7, wherein, upon the sensor unit receiving an adjustment magnetic field while the feedback current is not being supplied to the magnetic field generating unit, the adjusting unit adjusts the reference voltage such that the difference between the output voltage of the sensor unit and the reference voltage falls within a predetermined range as a result of the reception of the adjustment magnetic field.

9. The magnetic field measuring device according to claim 7, further comprising an adjustment current generating unit that generates an adjustment current, wherein
    the switching unit supplies the adjustment current to the magnetic field generating unit if the feedback current is not supplied to the magnetic field generating unit, and
    the adjusting unit uses the output voltage of the sensor unit generated while the adjustment current is being supplied to the magnetic field generating unit to adjust the reference voltage.

10. The magnetic field measuring device according to claim 9, wherein the adjusting unit adjusts the reference voltage based on a characteristic of the difference between the reference voltage and the output voltage of the sensor unit generated corresponding to the adjustment current.

11. The magnetic field measuring device according to claim 1, wherein the magnetic field measuring unit integrates measurement values obtained in a predetermined period, and outputs the integrated measurement values.

12. The magnetic field measuring device according to claim 1, wherein, before measurement of a measurement-target magnetic field performed by the magnetic field measuring unit, the adjusting unit makes the reference voltage generating unit generate the reference voltage that makes the feedback current generating unit generate a reset magnetic field to magnetically saturate the magnetoresistive element.

13. The magnetic field measuring device according to claim 12, wherein before measurement of a measurement-target magnetic field performed by the magnetic field measuring unit, the adjusting unit:
    changes a resistance value of a variable resistor provided in the reference voltage generating unit to make the reference voltage generating unit generate a reset magnetic field generating voltage that generates the reset magnetic field; and
    adjusts the reference voltage based on the resistance value of the variable resistor that generates the reset magnetic field generating voltage.

14. The magnetic field measuring device according to claim 13, wherein the adjusting unit adjusts the reference voltage by using the resistance value of the variable resistor which is set to ½ to ¼ of a range of an upper reset magnetic field generating resistance value and a lower magnetic field generating resistance value each of which generates the reset magnetic field generating voltage.

15. The magnetic field measuring device according to claim 12, wherein an output voltage range of the reference voltage generating unit is larger than an output voltage range of the sensor unit.

16. The magnetic field measuring device according to claim 1, further comprising a reset current generating unit that supplies, before measurement of a measurement-target magnetic field performed by the magnetic field measuring unit, the magnetic field generating unit with a reset current that generates a reset magnetic field to magnetically saturate the magnetoresistive element.

17. The magnetic field measuring device according to claim 1, further comprising a high-pass filter that allows passage therethrough of a high-frequency component of a measurement value output by the magnetic field measuring unit.

18. The magnetic field measuring device according to claim 1, wherein the feedback current generating unit is formed by using two or more operational amplifiers.

19. The magnetic field measuring device according to claim 1, wherein the sensor unit includes a magnetic flux concentrating unit arranged adjacent to the magnetoresistive element, and the feedback current generating unit is formed to surround the magnetoresistive element and the magnetic flux concentrating unit.

20. The magnetic field measuring device according to claim 1, wherein the magnetoresistive element includes a magnetization free layer, a non-magnetic layer, and a magnetization fixed layer that are stacked on a substrate in this order, and, when seen from above, the area of the magnetization fixed layer is smaller than the area of the magnetization free layer, and a magnetosensitive area is determined based on the area of the magnetization fixed layer.

21. The magnetic field measuring device according to claim 1, wherein the sensor unit has a first magnetoresistive element and a second magnetoresistive element that are connected in series and have opposite polarity to each other, and a voltage across the first magnetoresistive element and the second magnetoresistive element is output.

22. A magnetic field measurement method by which a magnetic field measuring device measures a magnetic field, the magnetic field measurement method comprising:

supplying, by the magnetic field measuring device and according to a difference between an output voltage of a sensor unit having at least one magnetoresistive element and a reference voltage output by a reference voltage generating unit, a magnetic field generating unit that generates a magnetic field to be applied to the sensor unit with a feedback current that generates a feedback magnetic field to diminish an input magnetic field to the sensor unit;

outputting a measurement value corresponding to the feedback current by the magnetic field measuring device; and adjusting, by the magnetic field measuring device, the reference voltage based on the output voltage of the sensor unit.

23. A recording medium having recorded thereon a magnetic field measurement program that, when executed by a computer, makes the computer function as:

a feedback current generating unit that supplies, according to a difference between an output voltage of a sensor unit having at least one magnetoresistive element and a reference voltage output by a reference voltage generating unit, a magnetic field generating unit that generates a magnetic field to be applied to the sensor unit with a feedback current that generates a feedback magnetic field to diminish an input magnetic field to the sensor unit;

a magnetic field measuring unit that outputs a measurement value corresponding to the feedback current; and an adjusting unit that uses the output voltage of the sensor unit to adjust the reference voltage.

\* \* \* \* \*